US012620428B2

(12) United States Patent
Lin et al.

(10) Patent No.: US 12,620,428 B2
(45) Date of Patent: May 5, 2026

(54) SELECTOR ONLY MEMORY WRITE OPERATION

(71) Applicant: Sandisk Technologies, Inc., Milpitas, CA (US)

(72) Inventors: Mark Lin, Santa Clara, CA (US); Dimitri Houssameddine, Sunnyvale, CA (US); Raj Ramanujan, Federal Way, WA (US); Christopher J. Petti, Mountain View, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 140 days.

(21) Appl. No.: 18/757,102

(22) Filed: Jun. 27, 2024

(65) Prior Publication Data

US 2026/0004835 A1       Jan. 1, 2026

(51) Int. Cl.
*G11C 11/16*          (2006.01)
(52) U.S. Cl.
CPC ...... *G11C 11/1675* (2013.01); *G11C 11/1673* (2013.01)
(58) Field of Classification Search
CPC .................................................. G11C 11/167
See application file for complete search history.

(56) References Cited

U.S. PATENT DOCUMENTS

| | | | | |
|---|---|---|---|---|
| 9,799,381 | B1 * | 10/2017 | Tortorelli | ........... G11C 13/0004 |
| 10,269,442 | B1 * | 4/2019 | Tortorelli | ............... G11C 29/52 |
| 11,309,024 | B2 | 4/2022 | Giduturi | |
| 11,735,276 | B2 | 8/2023 | Sebastiani et al. | |
| 11,763,886 | B2 | 9/2023 | Tortorelli et al. | |
| 11,848,051 | B2 | 12/2023 | Pellizzer | |
| 11,887,665 | B2 | 1/2024 | Giduturi | |
| 2012/0250440 | A1 | 10/2012 | Wu | |
| 2016/0276026 | A1 * | 9/2016 | Hase | .................. G11C 13/0097 |
| 2019/0043580 | A1 * | 2/2019 | Pirovano | ............... H10B 63/80 |
| 2019/0206489 | A1 * | 7/2019 | Wang | ................. G11C 13/0004 |
| 2022/0262437 | A1 | 8/2022 | Robustelli | |
| 2023/0215489 | A1 | 7/2023 | McCrate et al. | |
| 2023/0395135 | A1 | 12/2023 | Bedeschi et al. | |

OTHER PUBLICATIONS

Park, I.-M., et al., "Enhanced Endurance Characteristics in High Performance 16nm Selector Only Memory (SOM)," International Electron Devices Meeting (IEDM), Dec. 2023, 4 pages.
Ravsher, T., et al., "Self-Rectifying Memory Cell Based on SiGeAsSe Ovonic Threshold Switch", IEEE Transactions on Electronic Devices, vol. No. 5, pp. 2276-2281, (May 2023).

* cited by examiner

*Primary Examiner* — Douglas King
(74) *Attorney, Agent, or Firm* — Pearl Cohen Zedek Latzer Baratz LLP

(57)          ABSTRACT

Technology for programming selector-only memory cells in a cross-point memory structure. The threshold switching memory element may include, but is not limited to, an Ovonic Threshold Switch (OTS). The memory system removes Vth drift in the threshold switching memory elements prior to programming. The Vth drift is removed by applying a first voltage and a second voltage having opposite polarities to all of the SOM cells to be programmed. Then, two programming voltages having the two polarities are applied to program the cells to two states.

20 Claims, 16 Drawing Sheets

| Last Fire | New data for direct write | Vth |
|---|---|---|
| W1 ↑ | W1 ↑ | Low, B |
| | W0 ↓ | High, A |
| W0 or R0 ↓ | W1 ↑ | High, A |
| | W0 ↓ | Low, B |

401 —

| Top Electrode |
| :---: |
| 511 |

| Spacer 514 |
| :---: |

| Threshold Switching Selector (TSS) Memory Element |
| :---: |
| 502 |

| Spacer 512 |
| :---: |

| Bottom Electrode |
| :---: |
| 501 |

Assign a first polarity for a read signal (if not already assigned)

First bit value

704

Store first or second bit value?

Second bit value

706

Apply the first polarity programming signal to selected SOM cell

708

Apply a second polarity programming signal to selected SOM cell of memory cells (log)

810

820

R_ref

Vth

950

| Last Fire (952) | New data (954) | Vth (956) | Step 1 | Step 2 | Step 3 |
|---|---|---|---|---|---|
| W1 ↑ | W1 ↑ | Low, B | Read all cells → | Read all cells ← | Write ↓ / Write ↑ |
| W1 ↑ | W0 → | High, A | | | W1 ← |
| W0 → (or R0) | W1 ↑ | High, A | Fire cells with Vth=B, Vth B → C | Fire cells with Vth=B, Vth B → C | W0 ↓ |
| W0 → (or R0) | W0 → | Low, B | | | W1 ← / W0 ↓ |

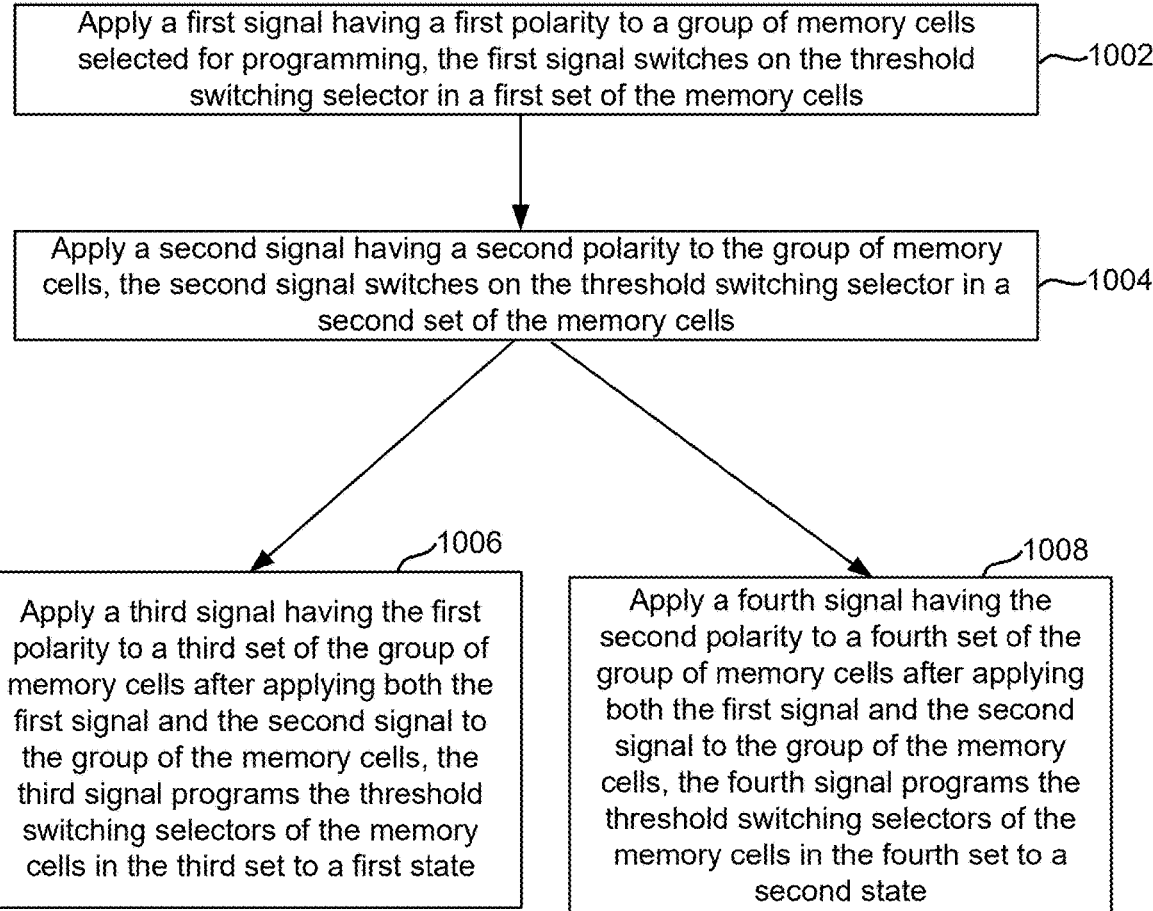

Apply a first signal having a first polarity to a group of memory cells selected for programming, the first signal switches on the threshold switching selector in a first set of the memory cells ~1002

Apply a second signal having a second polarity to the group of memory cells, the second signal switches on the threshold switching selector in a second set of the memory cells ~1004

Apply a third signal having the first polarity to a third set of the group of memory cells after applying both the first signal and the second signal to the group of the memory cells, the third signal programs the threshold switching selectors of the memory cells in the third set to a first state ~1006

Apply a fourth signal having the second polarity to a fourth set of the group of memory cells after applying both the first signal and the second signal to the group of the memory cells, the fourth signal programs the threshold switching selectors of the memory cells in the fourth set to a second state ~1008

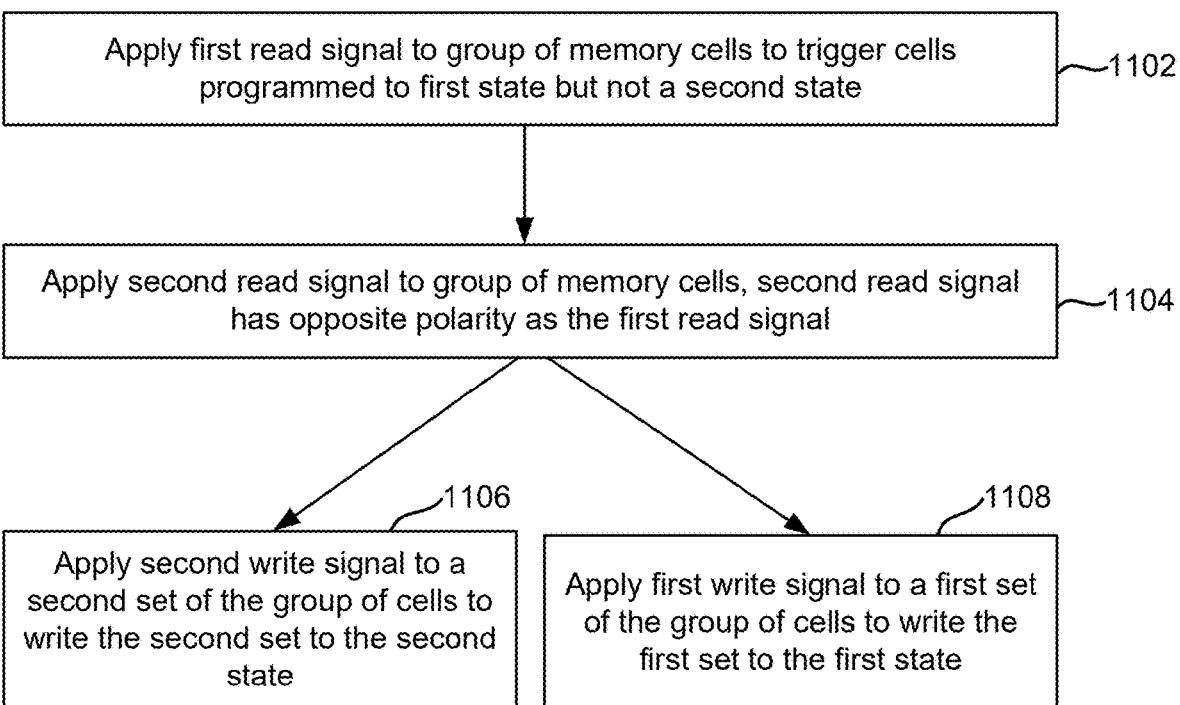

Apply first read signal to group of memory cells to trigger cells programmed to first state but not a second state    ~1102

Apply second read signal to group of memory cells, second read signal has opposite polarity as the first read signal    ~1104

1106

Apply second write signal to a second set of the group of cells to write the second set to the second state

1108

Apply first write signal to a first set of the group of cells to write the first set to the first state

FIG. 11

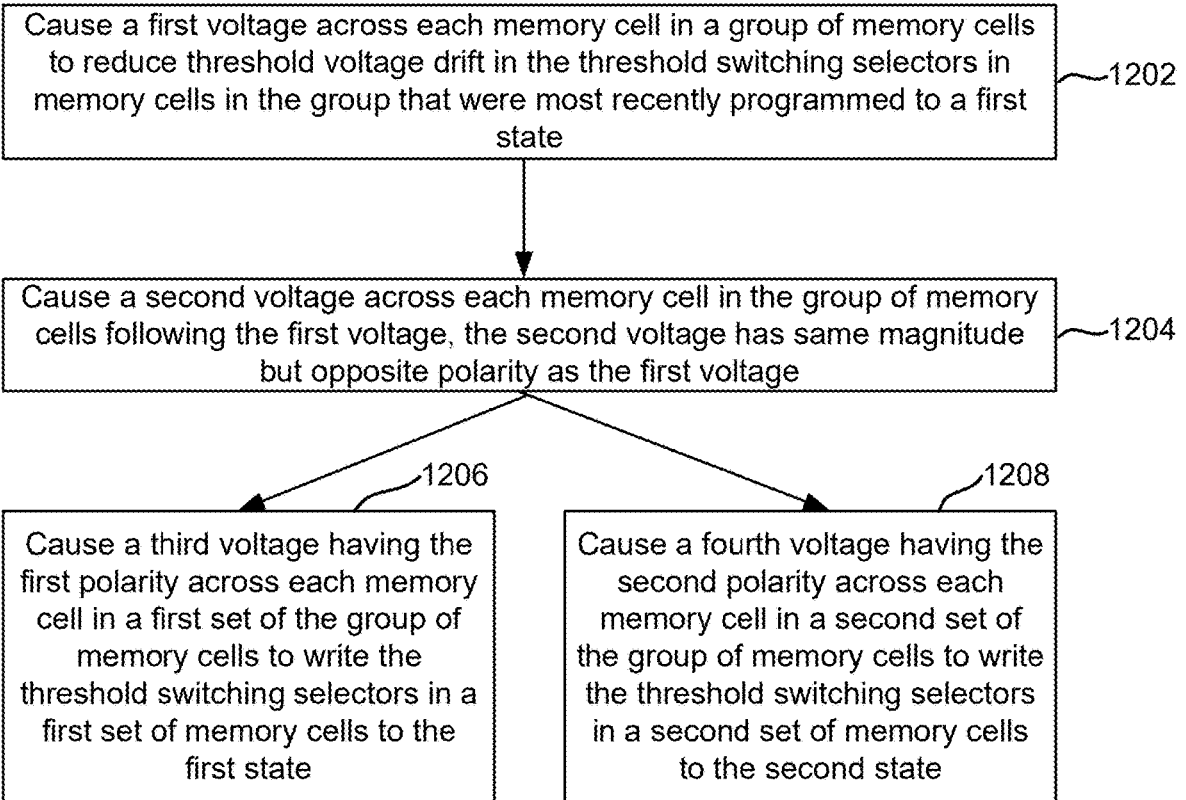

1200

Cause a first voltage across each memory cell in a group of memory cells to reduce threshold voltage drift in the threshold switching selectors in memory cells in the group that were most recently programmed to a first state ~1202

Cause a second voltage across each memory cell in the group of memory cells following the first voltage, the second voltage has same magnitude but opposite polarity as the first voltage ~1204

1206

Cause a third voltage having the first polarity across each memory cell in a first set of the group of memory cells to write the threshold switching selectors in a first set of memory cells to the first state

1208

Cause a fourth voltage having the second polarity across each memory cell in a second set of the group of memory cells to write the threshold switching selectors in a second set of memory cells to the second state

FIG. 12

SELECTOR ONLY MEMORY WRITE OPERATION

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

The memory cells may reside in a cross-point memory array. In a memory array with a cross-point type architecture, one set of conductive lines run across the surface of a substrate and another set of conductive lines are formed above the other set of conductive lines running in an orthogonal direction relative to the initial layer. The memory cells are located at the cross-point junctions of the two sets of conductive lines. Cross-point memory arrays are sometimes referred to as cross-bar memory arrays.

One type of memory cell contains a programmable resistance memory element, such as magnetoresistive memory element. A magnetoresistive random access memory (MRAM) cell uses magnetization to represent stored data. A bit of data is written to an MRAM cell by changing the direction of magnetization of a magnetic element ("the free layer") within the MRAM cell, and a bit is read by measuring the resistance of the MRAM cell, such resistance changing with the direction of magnetization. However, the cross-point memory array may have other types of memory cells. For example, the cross-point memory array may have memory cell of other technologies such as ReRam, PCM (Phase Change Memory), or FeRam.

In some cross-point memory architectures, each memory cell contains a threshold switching selector in series with a programmable resistance memory element. In such an architecture, the programmable resistance memory element is programmed to store data, whereas the threshold switching selector is used to select the memory cell. The threshold switching selector has a high resistance (in an off or non-conductive state) until it is biased to a voltage higher than its threshold voltage (Vt) or current above its threshold current, (It), and until its voltage bias falls below Vhold ("Voffset") or current below a holding current Ihold. After the Vt is exceeded and while Vhold is exceeded across the threshold switching selector, the threshold switching selector has a relatively lower resistance (in an on or conductive state). The threshold switching selector remains on until its current is lowered below a holding current Ihold, or the voltage is lowered below a holding voltage, Vhold. When this occurs, the threshold switching selector returns to the off (higher) resistance state. One example of a threshold switching selector is an Ovonic Threshold Switch (OTS). Other examples of threshold switching selectors include, but are not limited to, Volatile Conductive Bridge (VCB), Metal-Insulator-Metal (MIM), or other material that provides a highly non-linear dependence of current on select voltage.

In some cross-point architectures, the memory cell contains a threshold switching selector that is used as both a selector and the programmable memory element. Such architectures may be referred to as either a selector only memory (SOM) cell or a self-selecting memory cell. The threshold voltage (Vth) of a SOM cell when reading with a voltage of a given polarity may depend on the polarity of the write voltage used to program the SOM cell. A SOM cell that is written and read with the same polarity voltage may exhibit a lower Vth than if the SOM cell is written and read with opposite polarity voltages. The memory system may assign a default polarity to the read voltage, which allows the SOM cell to be programmed to a first state using a first polarity write voltage and to a second state with a second polarity write voltage opposite the first polarity.

However, over time the Vth of the threshold switching selector may drift, which presents technical challenges. FIG. 1A depicts a graph of threshold voltages of SOM cells over time. FIG. 1B is a table that shows a conventional programming scheme used in connection with the SOM cells. In this programming scheme state, W0 is written with the same polarity voltage as the read voltage. However, state W1 is written with the opposite polarity voltage as the read voltage. Read may be performed with a default polarity voltage. The read voltage polarity may be selected by the memory system, but will be the same with each read. Column 60 shows the last voltage that applied to the memory cell, which resulted in the cell firing (e.g., switching on the selector). The up-arrows and down-arrows in the table in FIG. 1B are used to represent the relative polarities of the voltages. Column 62 shows the new data to be written to the cell.

Referring now to FIG. 1A, SOM cells programmed to state W0 (with "down-polarity write voltage") and read immediately (with the "down-polarity read voltage") will have a Vth near the star 20. SOM cells programmed to state W1 (with "up-polarity write voltage") and read immediately (with the "down-polarity read voltage") will have a Vth near the star 22. Plot 10 shows the upward drift in Vt of the W0 state cells. If read (with the down-polarity read voltage) after a significant time delay the W0 cells may have a Vth near the B level Vth, as indicated by arrow 30. If read (with the down-polarity read voltage) after a significant time delay the W1 cells may have a Vth near the A level Vth, as indicated by arrow 32. The Vth column 64 in the table of FIG. 1B summarizes the Vth of a particular cell, which depends on the relative polarity of the last fire voltage (column 60) and the polarity of the write voltage (column 62). Cells having a last fire of W1 and new data of W1 have the same polarity voltage for these two voltages; therefore, a write of the new data W1 sees a low Vth of B. However, cells having a last fire of W1 and new data of W0 have opposite polarity voltages for these two voltages; therefore, a write of the new data W0 sees a high Vth of A. Cells having a last fire of W0 (or R0) and new data of W1 have the opposite polarity voltages for these two voltages; therefore, a write of the new data W1 sees a high Vth of A. Cells having a last fire of W0 (or R0) and new data of W0 have the same polarity voltages for these two voltages; therefore, write of the new data W0 sees a low Vth of B.

Reading or programming memory cells in a cross-bar architecture can encounter a "half-select" issue. When programming memory cells, the full program voltage is applied across the selected memory cell(s). The memory system may apply 0V across some of the cells that are not to be programmed ("fully-unselected cells"). However, in some techniques, the memory system applies one-half of the program voltage across some of the cells that are not to be programmed. Such cells are referred to as "half-selected cells." Depending on the Vth of the half-selected cells, it is possible that the threshold switching selector could undesirably switch on during a program operation. A similar half-select problem may occur during a read operation.

Referring again to FIG. 1A, a half-select (HS) margin shown. The HS margin may be calculated as Vth_Max/2− Vth_Min. In the example in FIG. 1A, Vth_Max is the maximum of plot 12 ("A") and Vth_Min is the minimum of plot 10. Therefore, the HS margin is the difference between dashed line 42 and dashed line 44.

BRIEF DESCRIPTION OF THE DRAWINGS

Like-numbered elements refer to common components in the different figures.

FIG. 5 illustrates an embodiment for the structure of an SOM cell.

FIG. 9A is a table showing details of one embodiment of programming SOM cells in cross-point memory structure.

FIG. 10 is a flowchart of one embodiment of a process of programming SOM cells in a cross-point memory structure.

FIG. 11 is a flowchart of one embodiment of a process of programming SOM cells in a cross-point memory structure.

FIG. 12 is a flowchart of one embodiment of a process of programming SOM cells in a cross-point memory structure.

DETAILED DESCRIPTION

Technology is disclosed for programming selector-only memory cells in a cross-point memory structure. The threshold switching memory element may include, but is not limited to, an Ovonic Threshold Switch (OTS). In an embodiment, the memory system removes Vth drift in the threshold switching memory elements prior to programming. Removing the Vth drift allows the memory system to use a lower magnitude for the program voltage. A lower magnitude for the program voltage reduces inadvertent selection of half-selected memory cells. In an embodiment, the Vth drift is removed by applying a first voltage and a second voltage having opposite polarities to all of the SOM cells to be programmed. Then, two programming voltages having the two polarities are applied to program the cells to two states. Moreover, the magnitude of the voltage used to remove the Vth drift may be chosen based on factors such as the expected Vth drift of the SOM cells.

Figures 1A, 1B:
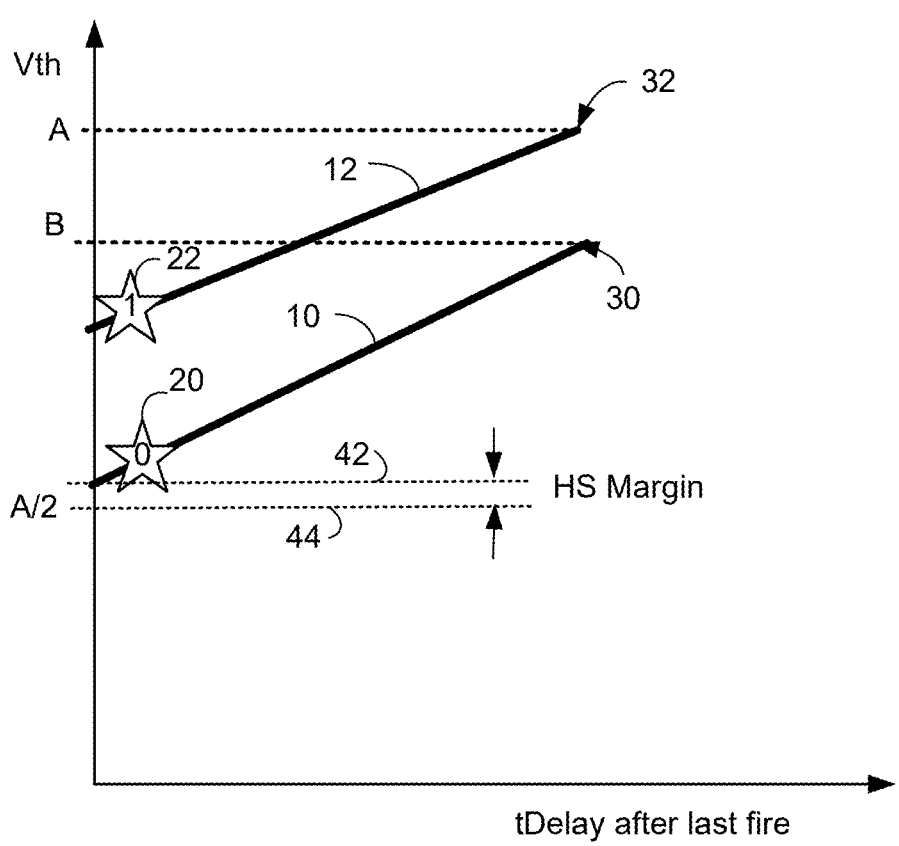
FIG. 1A depicts a graph of threshold voltages of SOM cells over time.
FIG. 1B is a table that shows a conventional programming scheme used in connection with the SOM cells.

Referring again to FIG. 1B, the High (or A) Vth in the Vth column 64 are problem threshold voltages that could potentially result in an inadvertent selection of a half-selected memory cell. This is because as the "A-level" increases the HS margin decreases. Embodiments of a programming process are able to reduce the Vth of cells prior to programming such that such problem cases do not exist. Therefore, the magnitude of the programming voltage can be lowered while still maintaining an adequate HS margin. Therefore, inadvertent selection of half-selected memory cells is prevented, or at least reduced.

In an embodiment the memory system contains SOM cells that reside in a cross-point memory array structure. In a memory array with a cross-point type architecture, one set of conductive lines run across the surface of a substrate and another set of conductive lines are formed over the other set of conductive lines, running over the substrate in a direction perpendicular to the other set of conductive lines. The memory cells are located at the cross-point junctions of the two sets of conductive lines. Cross-point memory arrays are sometimes referred to as cross-bar memory arrays.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially," "approximately," and/or "about" mean that the specified dimension or parameter may be varied within an acceptable tolerance for a given application.

Figure 2:
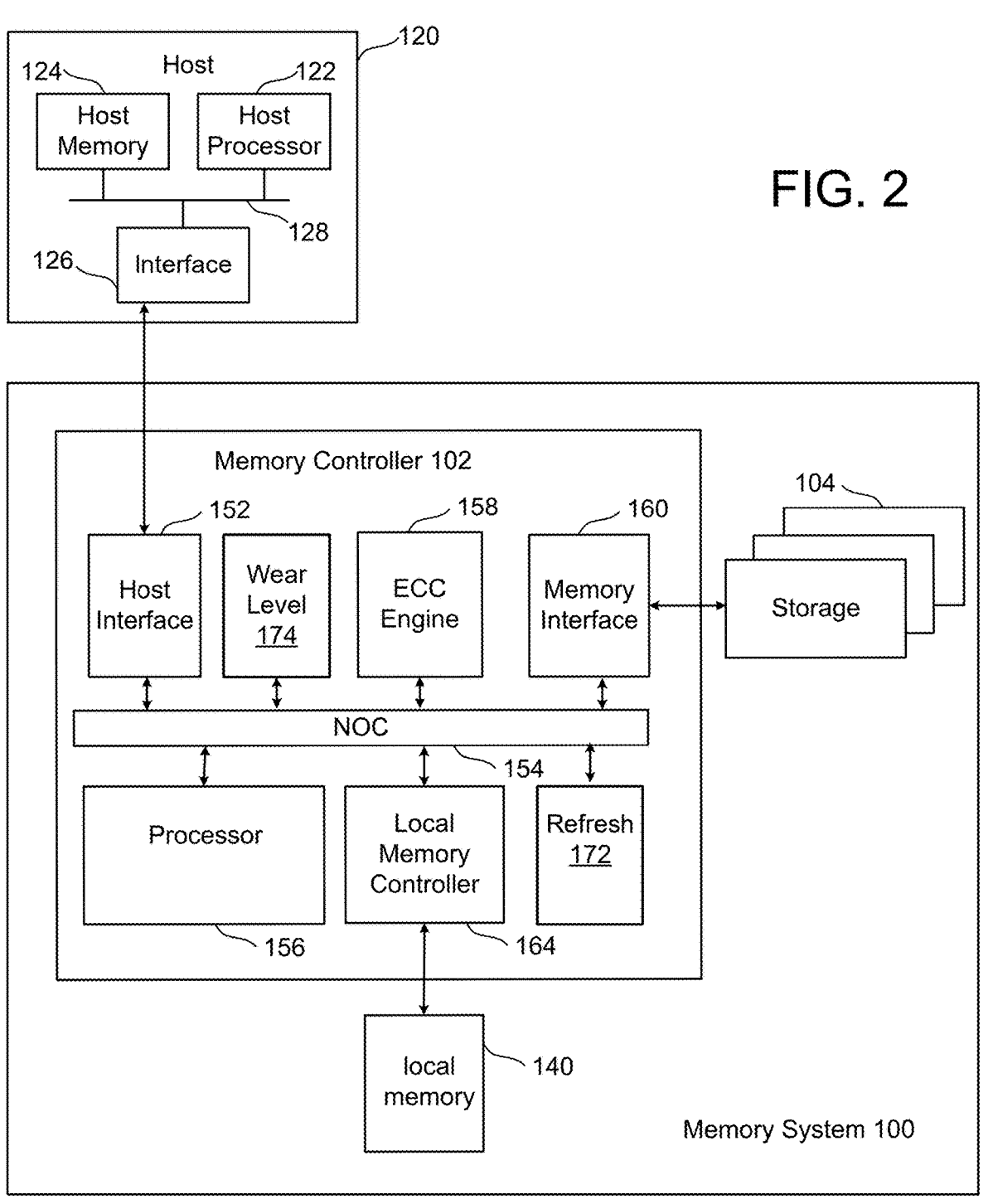
FIG. 2 is a block diagram of one embodiment of a non-volatile memory system connected to a host.

FIG. 2 is a block diagram of one embodiment of a non-volatile memory system (or more briefly "memory system") 100 connected to a host system 120. In an embodiment, the memory cells have a threshold switching selector such as an OTS. Many types of memory systems can be used with the technology proposed herein. Example memory systems include dual in-line memory modules (DIMMs), solid state drives ("SSDs"), memory cards and embedded memory devices; however, other types of memory systems can also be used.

Memory system 100 of FIG. 2 comprises a memory controller 102, memory 104 for storing data, and local memory 140 (e.g., SOM, MRAM, ReRAM, DRAM). The local memory 140 may be non-volatile and retain data after power off. The local memory 140 may be volatile and not be expected to retain data after power off. In one embodiment the local memory 140 contains SOM cells. In an embodiment, the local memory is not required to retain data after power-off. However, the local memory may retain data after power-off. In one embodiment, memory controller 102 and/or local memory controller 164 provides access to SOM cells in local memory 140. For example, memory controller 102 may provide for access in a cross-point array of SOM cells in local memory 140. In another embodiment the memory controller 102 or interface 126 or both are eliminated and the memory packages are connected directly to the host 120 through a bus such as DDRn. Or they are connected to a host memory management unit (MMU). In another instance, the memory controller 102 or portions are moved onto the memory 104 for direct connection of the Memory 104 to the Host, such as by providing parity bits, ECC, and wear level on the Memory 104 along with an DDRn interface to/from the host or MMU. The term memory system, as used throughout this document, is not limited to memory system 100. For example, the local memory 140 or the combination of local memory 140 and local memory controller 164 could be considered to be a memory system.

Likewise, host memory 124 or the combination of host processor 122 and host memory 124 considered to be a memory system.

The components of memory system 100 depicted in FIG. 2 are electrical circuits. The memory controller 102 has host interface 152, processor 156, ECC engine 158, memory interface 160, local memory controller 164, refresh logic 172, and wear level 174. The host interface 152 is connected to and in communication with host 120. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, local memory controller 164, refresh logic 172, and wear level 174. Local memory controller 164 is used to operate and communicate with local high speed memory 140 (e.g., MRAM). In other embodiments, local high speed memory 140 can be DRAM, SRAM or another type of volatile memory.

ECC engine 158 performs error correction services. For example, ECC engine 158 performs data encoding and decoding of parity bits provided on or off the memory as part of the code word used for error correction of the data fetched from memory 140 or 104. In one embodiment, ECC engine 158 is an electrical circuit programmed by software. For example, ECC engine 158 can be a processor that can be programmed. In other embodiments, ECC engine 158 is a custom and dedicated hardware circuit without any software. In one embodiment, the function of ECC engine 158 is implemented by processor 156. In one embodiment, local memory 140 has an ECC engine with or without a wear level engine. In one embodiment, memory 104 has an ECC engine with or without a wear level engine.

Processor 156 performs the various controller memory operations, such as programming, erasing, reading, and memory management processes including wear level. A separate wear level 174 is depicted, but the wear level 174 may be implemented by processor 156. Also, refresh logic 172 is depicted, but the refresh may also be implemented by the processor 156. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory dies. To implement this system, memory controller 102 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in memory 104 and a subset of the L2P tables are cached (L2P cache) in the local high speed memory 140.

Memory interface 160 communicates with storage 104. In an embodiment, storage 104 contains SOM cells in a cross-point array. In an embodiment, storage 104 contains NAND memory cells. In one embodiment, memory interface provides a Toggle Mode interface. Other interfaces can also be used. In some example implementations, memory interface 160 (or another portion of controller 102) implements a scheduler and buffer for transmitting data to and receiving data from one or more memory die.

In one embodiment, local memory 140 has an ECC engine. Local memory 140 may be used to help perform other functions such as wear leveling. Further details of on-chip memory maintenance are described in U.S. Pat. No. 10,545,692, titled "Memory Maintenance Operations During Refresh Window," and U.S. Pat. No. 10,885,991, titled "Data Rewrite During Refresh Window," both of which are hereby incorporated by reference in their entirety. In an embodiment, the local memory 140 is synchronous. In an embodiment, the local memory 140 is asynchronous.

In one embodiment, storage 104 comprises a plurality of memory packages. Each memory package includes one or more memory dies. Therefore, memory controller 102 is connected to one or more memory dies. In one embodiment, the memory package can include types of memory, such as storage class memory (SCM) based on programmable resistance random access memory (such as SOM, ReRAM, MRAM, FeRAM or RRAM) or a phase change memory (PCM). In one embodiment, memory controller 102 provides access to memory cells in a cross-point array in a storage 104.

Memory controller 102 communicates with host system 120 via an interface 152 that implements a protocol such as, for example, Compute Express Link (CXL). Or such controller can be eliminated and the memory packages can be placed directly on the host bus, DDRn or CXL for examples. For working with memory system 100, host system 120 includes a host processor 122, host memory 124, and interface 126 connected along bus 128. Host memory 124 is the host's physical memory, and can be SOM, DRAM, SRAM, ReRAM, MRAM, non-volatile memory, or another type of storage. In an embodiment, host memory 124 contains a cross-point array of programmable resistance memory cells, with each memory cell comprising a threshold switching selector to serve as a SOM cell.

Host system 120 is external to and separate from memory system 100. In one embodiment, memory system 100 is embedded in host system 120. Host memory 124 may be referred to herein as a memory system. The combination of the host processor 122 and host memory 124 may be referred to herein as a memory system. In an embodiment, such host memory can be cross-point memory using SOM cells.

Figure 3A:
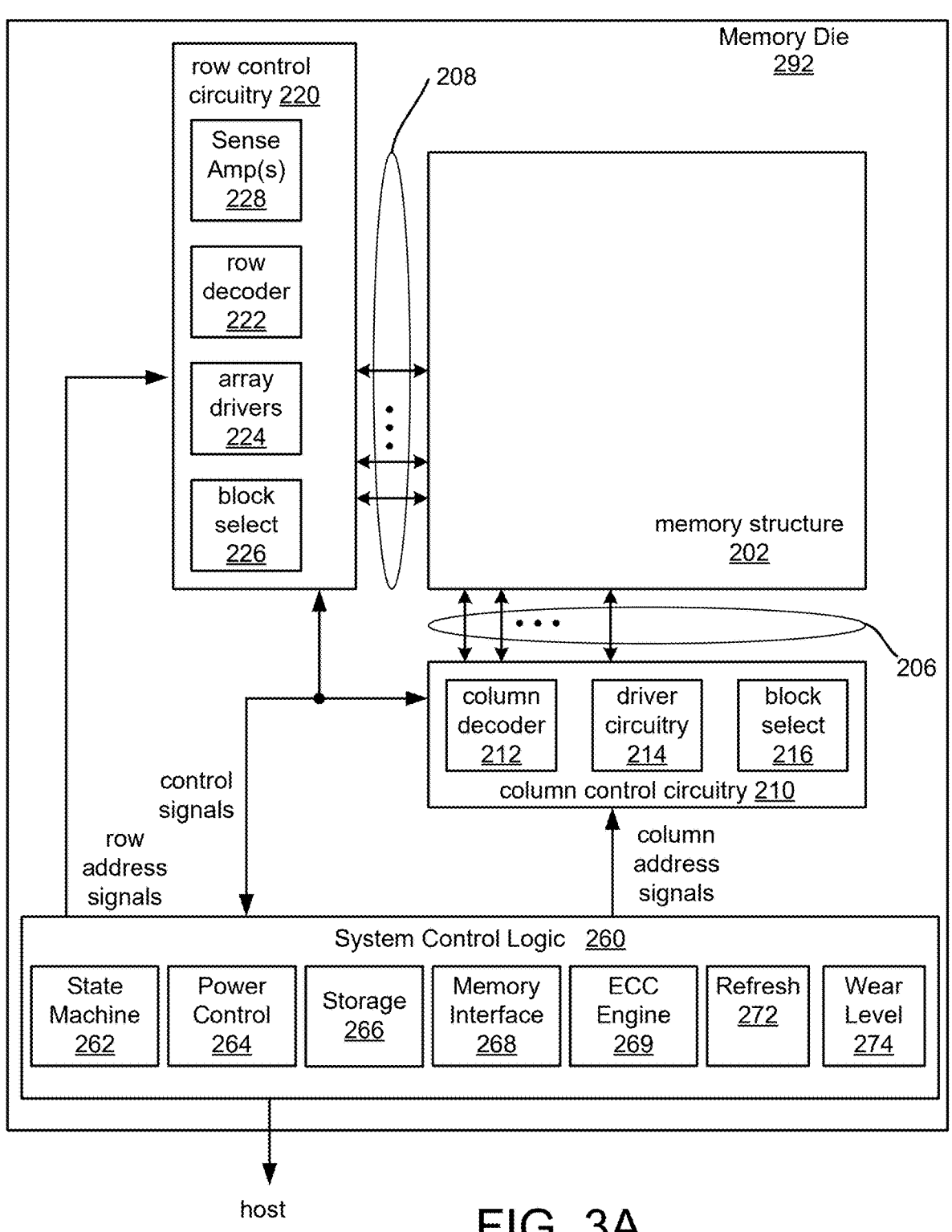
FIG. 3A is a block diagram of one embodiment of a memory die.

FIG. 3A is a block diagram that depicts one example of a memory die 292 that can implement the technology described herein. In one embodiment, memory die 292 is included in local memory 140, and in embodiment memory die 292 is included in storage 104. In one embodiment, memory die 292 is included in host memory 124. Memory die 292 includes a memory structure 202 that can include any of memory cells described in the following. The memory structure 202 may include one or more memory arrays. The array terminal lines of memory structure 202 include the various layer(s) of word lines organized as rows, and the various layer(s) of bit lines organized as columns. However, other orientations can also be implemented, including for example diagonal patterns to save space. Memory die 292 includes row control circuitry 220, whose outputs 208 are connected to respective word lines of the memory structure 202. Row control circuitry 220 receives a group of M row address signals and one or more various control signals from System Control Logic circuit 260, and typically may include such circuits as row decoders 222, row drivers 224, and block select circuitry 226 for both reading and writing operations. Row control circuitry 220 may also include read/write circuitry. In an embodiment, row decode and control circuitry 220 has sense amplifiers 228, which each contain circuitry for sensing a condition (e.g., voltage) of a word line of the memory structure 202. In an embodiment, by sensing a word line voltage, a condition or bit state of a memory cell (e.g., SOM cell) in a cross-point array is determined, either directly by a sense amp comparing the accessed memory cell voltage with a reference voltage. Memory die 292 also includes column decode and control circuitry 210 whose input/outputs 206 are connected to respective bit lines of the memory structure 202. Although only a single block is shown for memory structure 202, a memory die can include multiple arrays or "tiles" that can be individually accessed. Column control circuitry 210 receives a group of N column address signals and one or more various control signals from System Control Logic 260, and typically may include such circuits as column decoders 212, column decoders and drivers 214, block select circuitry 216, as well as read/write circuitry, and I/O multiplexers.

System control logic 260 receives data and commands from a host system and provides output data and status to the host system. In other embodiments, system control logic 260 receives data and commands from a separate controller circuit and provides output data to that controller circuit, with the controller circuit communicating with the host system. Such controller system may implement an interface such as DDR, DIMM, CXL, PCIe and others. In another embodiment those data and commands are sent and received directly from the memory packages to the Host without a separate controller, and any controller needed is within each die or within a die added to a multi-chip memory package. In some embodiments, the system control logic 260 can include a state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor. The system control logic 260 can also include a power control module 264 that controls the power, current source currents, and voltages supplied to the rows and columns of the memory structure 202 during memory operations and may include charge pumps and regulator circuit for creating regulating voltages, and on/off control of each for word line bit line selection of the memory cells. In some embodiments, the power control 264 includes one or more current sources. The current source(s) may be used to provide read and/or write currents. System control logic 260 includes storage 266, which may be used to store parameters for operating the memory structure 202. System control logic 260 also includes refresh logic 272 and wear leveling logic 274. Such system control logic may be commanded by the host 120 or memory controller 102 to refresh logic 272, which may load an on-chip stored row and column address (Pointer) which may be incremented after refresh. Such address bit(s) may be selected only (to refresh the OTS). Or such address may be read, corrected by steering through ECC engine 269, and then stored in a "spare" location, which is also being incremented (so all codewords are periodically read, corrected, and relocated in the entire chip under control of wear leveling logic 274) to in effect wear level so use of each bit across the chip is more uniform. Such operation may be more directly controlled by the host of an external controller, for example a PCIe or CXL or DDRn controller located separately from the memory chip or on the memory die.

Commands and data are transferred between memory controller 102 and the memory die 292 via memory controller interface 268 (also referred to as a "communication interface"). Such interface may be PCIe, CXL, DDRn for example. Memory controller interface 268 is an electrical interface for communicating with memory controller 102. Examples of memory controller interface 268 also include a Toggle Mode Interface. Other I/O interfaces can also be used. For example, memory controller interface 268 may implement a Toggle Mode Interface that connects to the Toggle Mode interfaces of memory interface 228/258 for memory controller 102. In one embodiment, memory controller interface 268 includes a set of input and/or output (I/O) pins that connect to the controller 102. In another embodiment, the interface is JEDEC standard DDRn or LPDDRn, such as DDR5 or LPDDR5, or a subset thereof with smaller page and/or relaxed timing.

System control logic 260 located in a controller on the memory die in the memory packages may include Error Correction Code (ECC) engine 269. ECC engine 269 may be referred to as an on-die ECC engine, as it is on the same semiconductor die as the memory cells. That is, the on-die ECC engine 269 may be used to encode data and parity bits that are to be stored in the memory structure 202, and to decode the decoded data and correct errors. The encoded data may be referred to herein as a codeword or as an ECC codeword. ECC engine 269 may be used to perform a decoding algorithm and to perform error correction. Hence, the ECC engine 269 may decode the ECC codeword. In an embodiment, the ECC engine 269 is able to decode the data more rapidly by direct decoding without iteration. Having the ECC engine 269 on the same die as the memory cells allows for faster decoding. The ECC engine 269 can use a wide variety of decoding algorithms including, but not limited to, Reed Solomon, a Bose-Chaudhuri-Hocquenghem (BCH), and low-density parity check (LDPC).

In some embodiments, all of the elements of memory die 292, including the system control logic 260, can be formed as part of a single die. In other embodiments, some or all of the system control logic 260 can be formed on a different die, e.g., external controller chip.

In one embodiment, memory structure 202 comprises a three-dimensional memory array of non-volatile or volatile memory cells in which multiple memory levels are formed above a single substrate, such as a wafer. The memory structure may comprise any type of non-volatile or volatile memory that are monolithically formed in one or more physical levels of memory cells having an active area disposed above a silicon or silicon on insulator (or other type of) substrate. In another embodiment, memory structure 202 comprises a two-dimensional memory array of non-volatile memory cells.

The exact type of memory array architecture or memory cell included in memory structure 202 is not limited to the examples above. Many different types of memory array architectures or memory technologies can be used to form memory structure 202. No particular non-volatile memory technology is required for purposes of the newly claimed embodiments proposed herein. Examples of suitable technologies for memory cell architectures of the memory structure 202 include two dimensional arrays, three dimensional arrays, cross-point arrays, stacked two dimensional arrays, vertical bit line arrays, and the like.

One example of a SOM cross-point memory includes an OTS selector/memory element arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

In some embodiments, the memory structure contains phase change memory (PCM). Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). The memory cells are programmed by current pulses that can change the co-ordination of the PCM material or switch it between amorphous and crystalline states. Note that the use of "pulse" in this document does not require a square pulse but includes a (continuous or non-continuous) vibration or burst of sound, current, voltage, light, or other wave. And the current forced for a write can, for example, be driven rapidly to a peak value and then linearly ramped lower with, for example, a 500 ns edge rate. Such peak current force may be limited by a zoned voltage compliance that varies by position of the memory cell along the word line or bit line. In an embodiment, a phase change memory cell has a phase change memory element in series with a threshold switching selector such as an OTS.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the memory structure 202 and the peripheral circuitry, including all of the other elements. An important characteristic of a memory circuit is its capacity, which can be increased by increasing the area of the memory die 292 that is given over to the memory structure 202; however, this reduces the area of the memory die available for the peripheral circuitry or increases cost which is related to chip area. This can place quite severe restrictions on these peripheral elements. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die 292 is the amount of area to devote to the memory structure 202 and the amount of area to devote to the peripheral circuitry. Such tradeoffs may result in more IR drop from use of larger x-y arrays of memory between driving circuits on the word line and bit line, which in turn may benefit more from use of voltage limit and zoning of the voltage compliance by memory cell position along the word line and bit line.

Another area in which the memory structure 202 and the peripheral circuitry are often at odds is in the processing involved in forming these regions, since these regions often involve differing processing technologies and the trade-off in having differing technologies on a single die. For example, elements such as sense amplifier circuits, charge pumps, logic elements in a state machine, and other peripheral circuitry in system control logic 260 often employ PMOS devices. In some cases, the memory structure will be based on CMOS devices. Processing operations for manufacturing a CMOS die will differ in many aspects from the processing operations optimized for NMOS-only technologies.

Figure 3B:
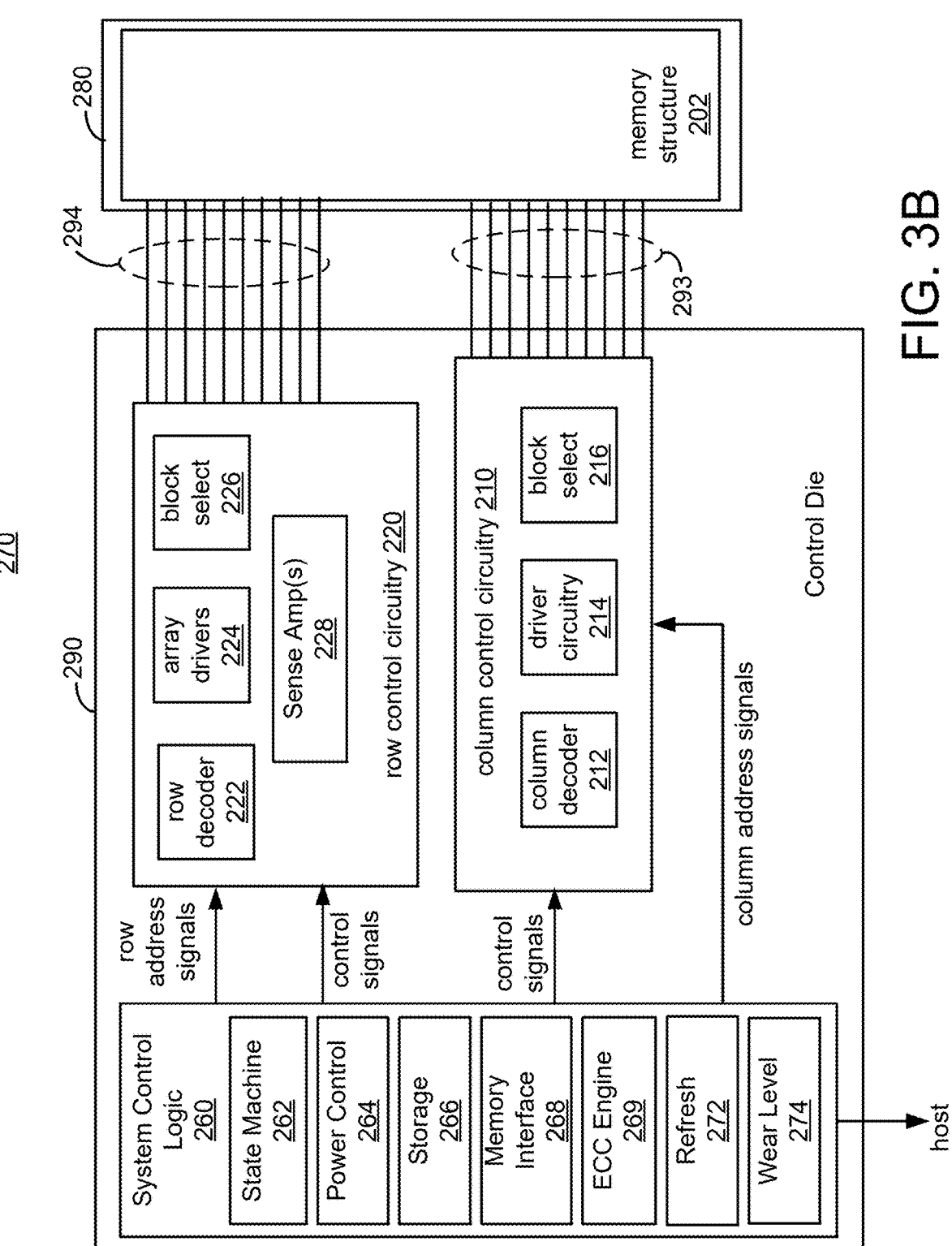
FIG. 3B is a block diagram of one embodiment of an integrated memory assembly containing a control die and a memory structure die.

To improve upon these limitations, embodiments described below can separate the elements of FIG. 3A onto separately formed die that are then bonded together. FIG. 3B depicts an integrated memory assembly 270 having a memory structure die 280 and a control die 290. The memory structure 202 is formed on the memory structure die 280 and some or all of the peripheral circuitry elements, including one or more control circuits, are formed on the control die 290. For example, a memory structure die 280 can be formed of just the memory elements, such as the array of SOM cells, or other memory type. Some or all of the peripheral circuitry, even including elements such as decoders, current sources, and sense amplifiers, can then be moved on to the control die. This allows each of the semiconductor die to be optimized individually according to its technology. This allows more space for the peripheral elements, which can now incorporate additional capabilities that could not be readily incorporated were they restricted to the margins of the same die holding the memory cell array. The two die can then be bonded together in a bonded multi-die integrated memory assembly, with the array on the one die connected to the periphery elements on the other die. Although the following will focus on an integrated memory assembly of one memory die and one control die, other embodiments can use additional die, such as two memory die and one control die, for example.

As with memory die 292 of FIG. 3A, the memory structure die 280 in FIG. 3B includes a memory structure 202 that can include multiple independently accessible arrays or "tiles." System control logic 260, row control circuitry 220, and column control circuitry 210 are located in control die 290. In some embodiments, all or a portion of the column control circuitry 210 and all or a portion of the row control circuitry 220 are located on the memory structure die 280. In some embodiments, some of the circuitry in the system control logic 260 is located on the on the memory structure die 280.

FIG. 3B shows column control circuitry 210 on the control die 290 coupled to memory structure 202 on the memory structure die 280 through electrical paths 293. For example, electrical paths 293 may provide electrical connection between column decoder 212, column driver circuitry 214, and block select 216 and bit lines of memory structure 202. Electrical paths may extend from column control circuitry 210 in control die 290 through pads on control die 290 that are bonded to corresponding pads of the memory structure die 280, which are connected to bit lines of memory structure 202. Each bit line of memory structure 202 may have a corresponding electrical path in electrical paths 293, including a pair of bond pads, which connects to column control circuitry 210. Similarly, row control circuitry 220, including row decoder 222, row drivers 224, block select 226, and sense amplifiers 228 are coupled to memory structure 202 through electrical paths 294. Each of electrical path 294 may correspond to, for example, a word line. Additional electrical paths may also be provided between control die 290 and memory structure die 280.

For purposes of this document, the phrase "a control circuit" can include one or more of memory controller 102, local memory controller 164, processor 156, system control logic 260, column control circuitry 210, row control circuitry 220, host processor 122, a micro-controller, a state machine, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit. Such control circuitry may include drivers such as direct drive via connection of a node through fully on transistors (gate to the power supply) driving to a fixed voltage such as a power supply. Such control circuitry may include a current source driver.

For purposes of this document, the term "apparatus" can include, but is not limited to, one or more of memory system 100, local memory 140, the combination of local memory controller 164 and/or memory controller 102 and local memory 140, storage 104, memory die 292, integrated memory assembly 270, and/or control die 290.

In the following discussion, the memory structure 202 of FIGS. 3A and 3B will be discussed in the context of a cross-point architecture. In a cross-point architecture, a first set of conductive lines or wires, such as word lines, run in a first direction relative to the underlying substrate and a second set of conductive lines or wires, such a bit lines, run in a second direction relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using SOM cells, each having a threshold switching selector such as Ovonic Threshold Switch (OTS) to comprise a selectable memory bit. However, embodiments are not limited to the selector being an OTS.

Figure 4A:
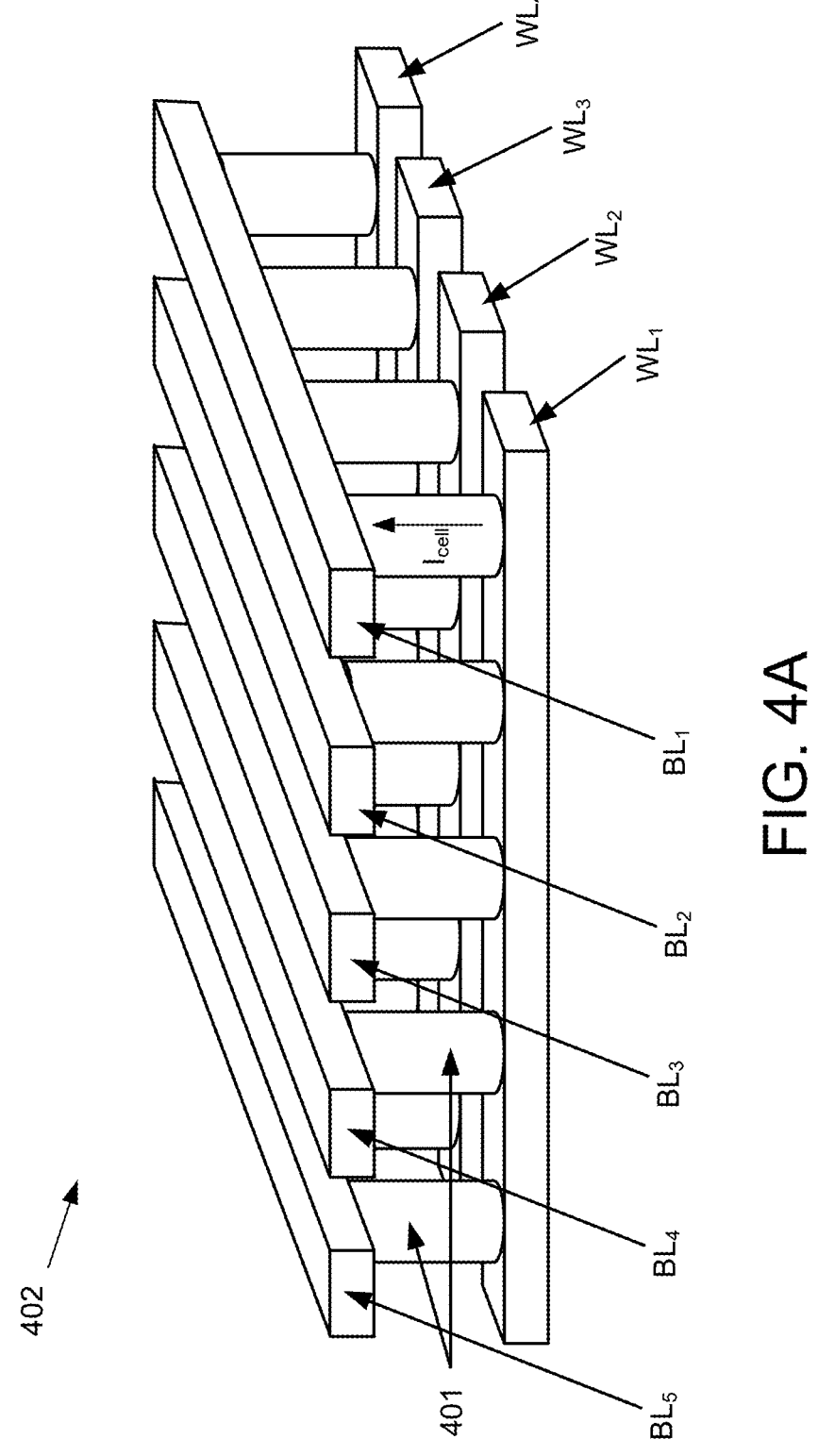
FIG. 4A depicts one embodiment of a portion of a memory array that forms a cross-point architecture in an oblique view.

FIG. 4A depicts one embodiment of a portion of a memory array 402 that forms a cross-point architecture in an oblique view. Memory array 402 of FIG. 4A is one example of an implementation for memory structure 202 in FIG. 3A or 3B, where a memory die 292 or memory structure die 280 can include multiple such memory arrays 402. The memory array 402 may be included in local memory 140 or host memory 124. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction, or diagonal to provide intersections where memory cells are interconnected between WLs and BLs. FIG. 4A is an example of a horizontal cross-point structure in which word lines $WL_1$-$WL_5$ and $BL_1$-$BL_5$ both run in a horizontal direction relative to the substrate, while the memory cells, two of which are indicated at 401, are oriented so that the current through a memory cell (such as shown at $I_{cell}$) runs in the vertical direction. In a memory array with additional layers of memory cells, such as discussed below with respect to FIG. 4D, there would be corresponding additional layers of bit lines and word lines. One pattern, for example, would be from the bottom layer: WL, memory cell, BL, memory cell, WL, WL, memory cell, BL memory cell, WL.

As depicted in FIG. 4A, memory array 402 includes a plurality of memory cells 401. The memory cells 401 may include re-writeable memory elements, such as can be implemented using a threshold switching selector, which may be operated to have a programmable resistance. The memory cells 401 may be referred to herein as programmable resistance memory cells. The memory cells 401 may also be referred to herein as self-selecting memory cells or selector only memory cells. The threshold switching selectors can be implemented using an Ovonic Threshold Switch (OTS), Volatile Conductive Bridge (VCB), Metal-Insulator-Metal (MIM), or other material that provides a highly non-linear dependence of current or resistance for varying select voltage. The following discussion will focus on memory cells composed of an OTS memory element, although much of the discussion can be applied more generally. The current in the memory cells of the first memory level is shown as flowing upward as indicated by arrow $I_{cell}$, but current can flow in either direction to either read or write the memory cell bit state, as is discussed in more detail in the following.

Figure 4B:
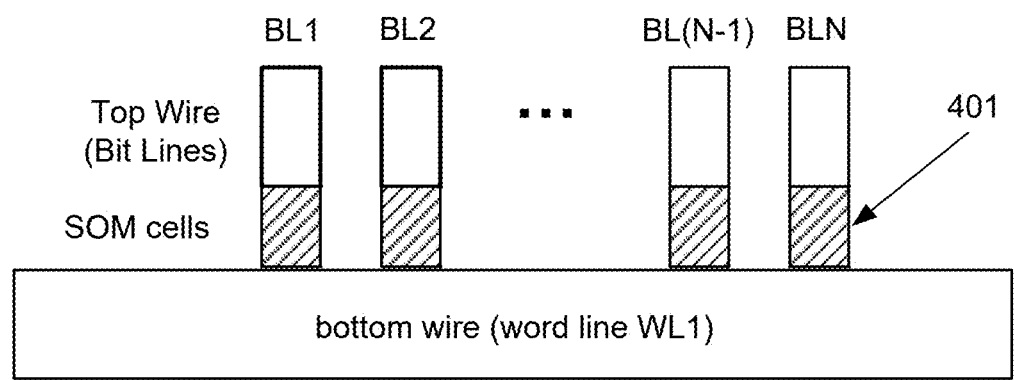
FIGS. 4B and 4C respectively present side and top views of the cross-point structure in FIG. 4A.
Figure 4C:
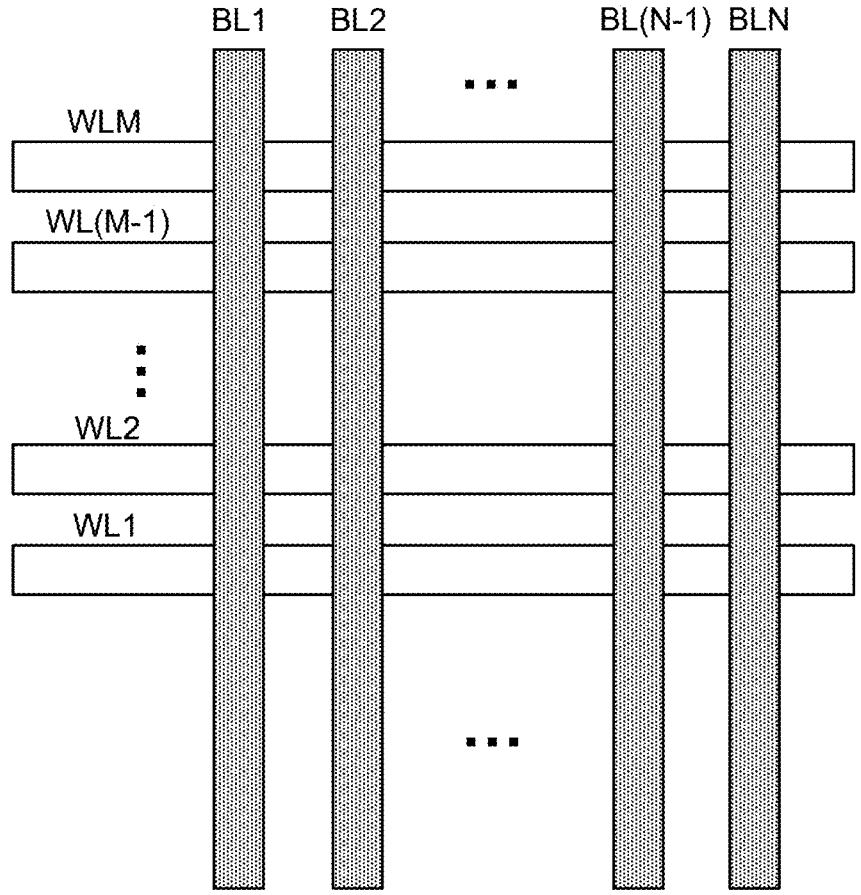

FIGS. 4B and 4C respectively present side and top views of the cross-point structure in FIG. 4A. The sideview of FIG. 4B shows one bottom wire, or word line, $WL_1$ and the top wires, or bit lines, $BL_1$-$BL_n$. At the cross-point between each top wire and bottom wire is a SOM memory cell 401. FIG. 4C is a top view illustrating the cross-point structure for M bottom wires $WL_1$-$WL_M$ and N top wires $BL_1$-$BL_N$. In a binary embodiment, the SOM cell at each cross-point can be programmed into one of two resistance states: high and low. More detail on embodiments for an SOM memory cell design and techniques for their programming are given below. In some embodiments, sets of these wires are arrayed continuously as a "tile," and such tiles may be paired adjacently in the Word Line (WL) direction and orthogonally in the Bit Line direction to create a module. Such a module may be composed of 2×2 tiles to form a four tile combination wherein the WL drivers between the tiles is "center driven" between the tiles with the WL running continuously over the transistor driver at the approximate center of the line. Similarly, BL drivers may be located between the pair of tiles paired in the BL direction to be center driven, whereby the transistor driver and its area is shared between a pair of tiles. Vias of copper or other types of low resistance may decode and connect the transistor driver/selects to the WL or BL. In addition to the memory element in the memory cell between WL and BL may also be included a series select element such as an OTS.

The cross-point array of FIG. 4A illustrates an embodiment with one layer of word lines and bits lines, with the SOM or other memory technology for the memory cells sited at the intersection of the two sets of conducting lines. To increase the storage density of a memory die, multiple layers of such memory cells and conductive lines can be formed. A two-layer example is illustrated in FIG. 4D.

Figure 4D:
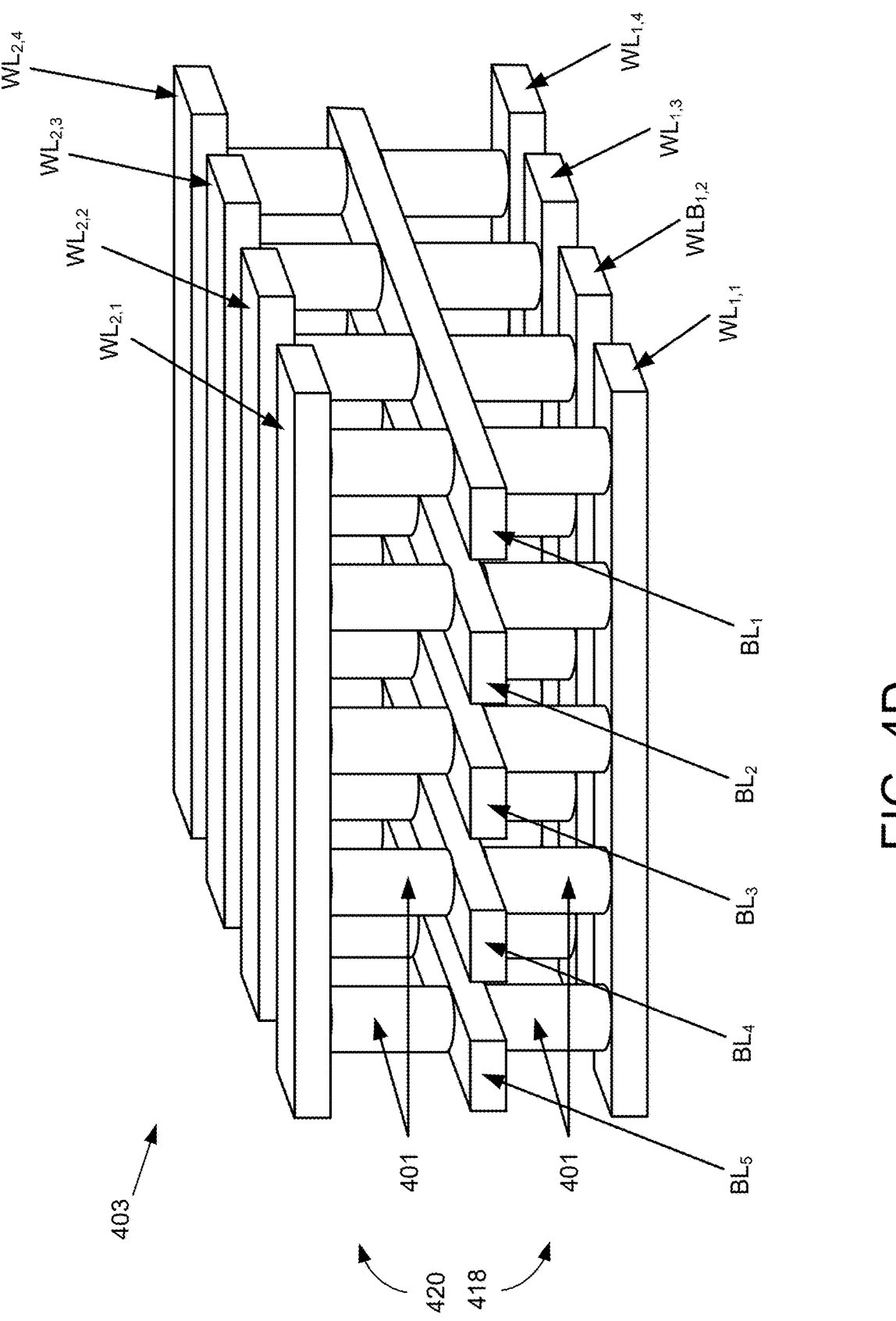
FIG. 4D depicts an embodiment of a portion of a two-level memory array that forms a cross-point architecture in an oblique view.

FIG. 4D depicts an embodiment of a portion of a two-level memory array that forms a cross-point architecture in an oblique view. As in FIG. 4A, FIG. 4D shows a first layer 418 of memory cells 401 of a memory array 403 connected at the cross-points of the first layer of word lines $WL_{1,1}$-$WL_{1,4}$ and bit lines $BL_1$-$BL_5$ above. Memory array 403 may be included in memory structure 202 of FIG. 3A or 3B. A second layer 420 of memory cells is formed above the bit lines $BL_1$-$BL_5$ and between these bit lines and a second set of word lines $WL_{2,1}$-$WL_{2,4}$. In effect the BLs are shared. In the alternative a second layer may include another deck of BL above the BL shown and below the $2^{nd}$ deck of WL. Although FIG. 4D shows two layers, 418 and 420, of memory cells, the structure can be extended upward through additional alternating layers of word lines and bit lines in a similar pattern. Depending on the embodiment, the word lines and bit lines of the array of FIG. 4D can be biased for read or program operations such that current in each layer flows from the word line layer to the bit line layer or the other way around. The two layers can be structured to have current flow in the same direction in each layer for a given operation or to have current flow in the opposite directions by driver selection in the positive or negative direction. The memory cell may be placed in the same orientation within the first and second layers enabling use of current in opposi-tive directions by layer to read or write. Or the memory cell placed in a reversed or flipped direction when placed between the BL and WL in the second layer (enabling use of current in the same direction as is used to read or write in memory cells within the first layer. As will be apparent to someone reasonably skilled in the art, the two layers can be extended to three or more layers.

The use of a cross-point architecture allows for arrays with a small footprint and several such arrays can be formed on a single die. The memory cells formed at each cross-point can be a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used in the memory die 292 of FIG. 3A, the local memory 140 in FIG. 2, and/or the host memory 124 in FIG. 2, or in any other configuration where additional memory is useful. Resistive type memory cells can be formed according to many of the technologies mentioned herein, such as OTS. The following discussion is presented mainly in the context of memory arrays using a cross-point architecture with binary valued OTS memory cells, although much of the discussion is more generally applicable to other memory elements in memory cells within a cross-point array or other configurations apparent to those reasonably skilled in the art.

Figure 5:
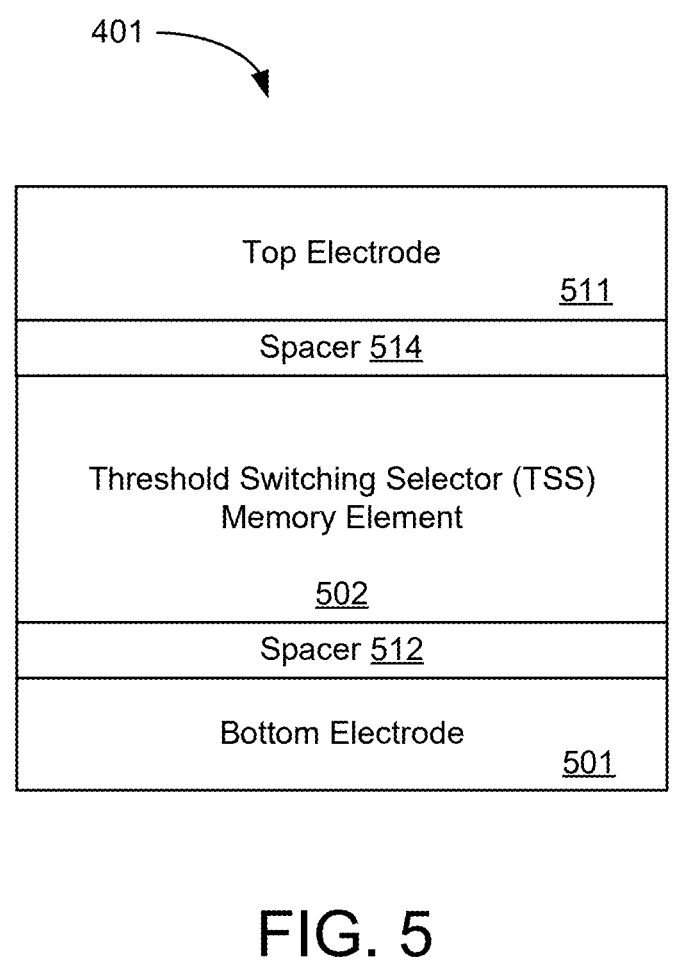

FIG. 5 illustrates the structure of an embodiment for an SOM cell. The SOM cell 401 may be used as the program-mable resistance memory cell 401 in, for example, FIGS. 4A-4D. The SOM cell includes a bottom electrode 501, spacer 512, a threshold switching selector (TSS) memory element 502, spacer 514, and a top electrode 511. In some embodiments, the bottom electrode 501 is a word line and the top electrode 511 is a bit line. In other embodiments, the bottom electrode 501 is a bit line and the top electrode 511 is a word line. The state of the memory cell is based on the state of the TSS memory element 502.

Data is written to an SOM memory cell by programming the TSS memory element 502 with a program (or write) signal (e.g., program current, program voltage) having a desired polarity. In one embodiment, the SOM memory cell is programmed to a first state (W0) using a first polarity program signal and to a second state (W1) using a second polarity program signal. The SOM memory cell may be read using a read signal (e.g., read current, read voltage). The polarity of the read signal relative to the polarity of the program signal may impact the Vth of the SOM cell. In an embodiment, a read signal having the same polarity as the program signal results in a lower Vth than a read signal having the opposite polarity as the program signal. Typi-cally, the memory system will choose a polarity for the read signal and then be consistent with that polarity of read signal when determining the state of the SOM cell. Therefore, the polarity of the program signal will, in effect, result in a higher/lower Vth when read with the chosen polarity read signal.

The threshold switching selector 502 may also serve as a selector to select the memory cell for a memory operation. The threshold switching selector 502 has a high resistance (in an off or non-conductive state) until it is biased to a voltage higher than its threshold voltage (Vth) or current above its threshold current, and until its voltage bias falls below Vhold (also known as "Voffset") or current below Ihold. After the Vth is exceeded and while Vhold is exceeded across the switching selector, the switching selec-tor has a low resistance (in an on or conductive state). The threshold switching selector remains on until its current is lowered below a holding current Ihold, or the voltage is lowered below a holding voltage, Vhold. When this occurs, the threshold switching selector returns to the off (higher) resistance state. Accordingly, to select a memory cell at a cross-point, a voltage or current is applied which is sufficient to turn on the associated threshold switching selector. One set of examples for a threshold switching selector is an ovonic threshold switching material of an Ovonic Threshold Switch (OTS). Example threshold switching materials include Ge—Se, Ge—Se—N, Ge—Se—As, Ge—Se—Sb—N, Ge58Se42, GeTe$_6$, Si—Te, Zn—Te, C—Te, B—Te, Ge—As—Te—Si—N, Ge—As—Se—Te—Si and Ge—Se—As—Te, with atomic percentages ranging from a few percent to more than 90 percent for each element. In an embodiment, the threshold switching selector is a two ter-minal device. The threshold switching selector 502 can also contain additional conducting layers. For example, spacer 514 is depicted between switching selector 502 and top electrode 511. The spacer layer 514 can be a single con-ducting layer or composed of multiple conducting layers. The threshold switching selector 502 can also contain addi-tional conducting layers on the interface with the bottom electrode 501. For example, spacer 512 is depicted between switching selector 502 and bottom electrode 501. The spacer layer 512 on the interface with bottom electrode 501 can be a single conducting layer or composed of multiple conduct-ing layers. Examples of conducting layers adjacent to the OTS include carbon, carbon nitride, carbon silicide, carbon tungsten, titanium, titanium nitride, tungsten, tungsten nitride, tantalum, tantalum nitride, and others. Threshold voltage switches have a Threshold Voltage (Vt) above which the resistance of the device changes substantially from insulating, or quasi insulating, to conducting.

Figure 6A:
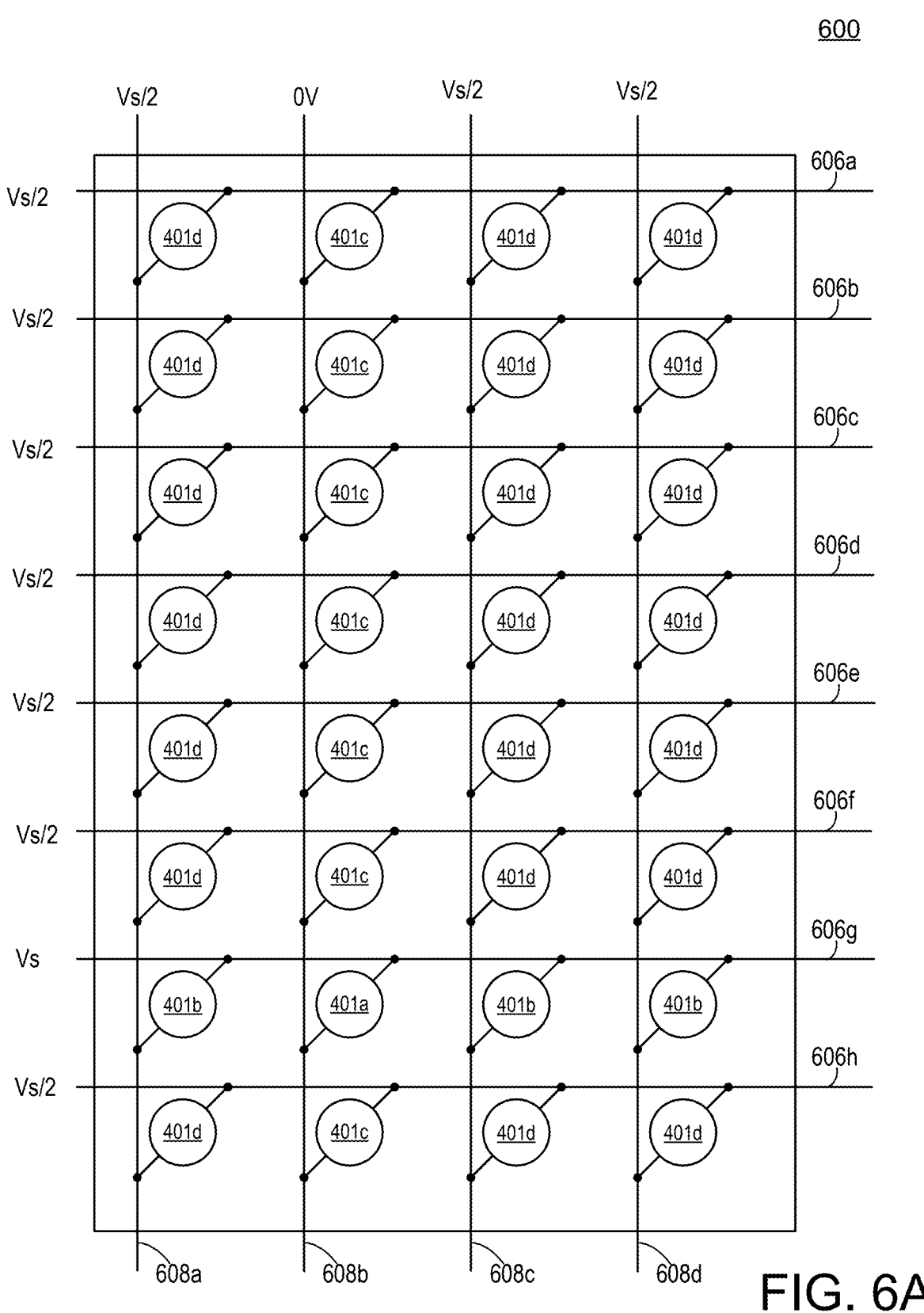
FIGS. 6A and 6B illustrate embodiments for the accessing a selected SOM cell in a cross-point memory structure.

FIG. 6A depicts an embodiment of a memory array 600 having a cross-point architecture. The memory array 600 may be included in memory structure 202 of FIG. 3A or 3B. The array 600 has a set of first conductive lines 606a-606h and a set of second conductive lines 608a-608d. In one embodiment, the set of first conductive lines 606a-606h are word lines and the set of second conductive lines 608a-608b are bit lines. For ease of discussion, the set of first conductive lines 606a-606h may be referred to as word lines and the set of second conductive lines 608a-608b may be referred to as bit lines. However, the set of first conductive lines 606a-606h could be bit lines and the set of second conductive lines 608a-608b could be word lines.

The memory array 600 has a number of programmable resistance memory cells 401. The programmable resistance memory cells 401 may be referred to as self-selecting memory cells or selector-only memory cells. In an embodiment, each cell 401 has a structure similar to the cell in FIG. 5. Each memory cell 401 is connected between one of the first conductive lines 606 and one of the second conductive lines 608 (e.g., at the cross point of one of the first conductive lines 606 and one of the second conductive lines 608). Each SOM cell 401 has a threshold switching selector (not depicted in FIG. 6A). The threshold switching selector 502 becomes conductive in response to application of a voltage level exceeding a threshold voltage of the threshold switching selector 502, and remains conductive with lower resistance until the current through the switching selector 502 is reduced below the selector holding current, Ihold. The threshold switching selector 502 may be a two terminal device. In an embodiment, the threshold switching selector 502 comprises an OTS.

Techniques are disclosed for programming SOM cells. For purpose of discussion, memory cell 401a is being selected for a memory operation such as read or write. An example of programming the threshold switching selector 502 will be discussed. Selected memory cell 401a is at the cross-point of selected word line 606g and selected bit line 608b. A selected memory cell means a memory cell that is selected for a memory operation such as read or write. A selected memory cell is connected between a selected word line and a selected bit line. In an embodiment, to program a selected memory cell 401, a select voltage such as near ground is provided to the selected bit line (e.g., bit line 608b) and program (or write) voltage (Vs) is applied to a selected word line (e.g., word line 606g). A selected word line means that the word line is connected to at least one selected memory cell. Alternatively, the memory cell could be selected by applying the program voltage (Vs) to the selected bit line while applying a select voltage to the selected word line.

In one approach word lines that are not connected to the selected memory cell may be driven by a voltage that is approximately one-half the magnitude of the voltage across the selected cell. As depicted in FIG. 6A, word lines 606a, 606b, 606c, 606d, 606e, 606f, and 606h each have what is referred to as a half-select voltage (Vs/2) applied thereto. The half-select voltage (Vs/2) has approximately one-half the magnitude of the voltage across the selected cell (Vs). For programming, the voltage Vs may be referred to as a program voltage. For example, the voltage Vs may be referred to as a read voltage.

In one approach bit lines that are not connected to the selected memory cell may be driven by a voltage that is approximately one-half the magnitude of the voltage across the selected cell. As depicted in FIG. 6A, bit lines 608a, 608c, and 608d each have what is referred to as a half-select voltage (Vs/2) applied thereto. As noted above, the half-select voltage (Vs/2) has approximately one-half the magnitude of the voltage across the selected cell (Vs).

Some of the memory cells connected to the selected word line are what is referred to herein as half-selected memory cells. The voltage across a half-selected memory cell is approximately half of the voltage across a selected memory cell. The half-selected memory cells 401b connected to the selected word line each have Vs applied to the selected word line and Vs/2 applied to their respective bit lines. Therefore, half-selected memory cells 401b each have Vs/2 applied across the memory cell.

Some of the memory cells connected to the selected bit line are what is referred to herein as half-selected memory cells. The voltage across these half-selected memory cell is approximately half of the voltage across the selected memory cell. The half-selected memory cells 401c connected to the selected bit line each have 0V applied to the selected bit line and Vs/2 applied to their respective word lines. Therefore, half-selected memory cells 401c each have Vs/2 applied across the memory cell.

The threshold switching selector 502 in such half-selected memory cells 401b, 401c should not turn on during operations such as read or write. However, if the Vth of the threshold switching selector 502 is less than Vs/2 then the threshold switching selector 502 could turn on during a memory operation. Techniques are disclosed herein for preventing (or at least reducing the chance of) the threshold switching selectors 502 in half-selected memory cells 401b, 401c from turning on during a memory operation such as read or write. In an embodiment, Vth drift is removed from memory cells prior to programming, which allows the program voltage to have a lower magnitude. Using a lower magnitude for the program voltage will lower the magnitude of Vs/2, which reduces the probability of inadvertent selection of a half-selected memory cell.

Other memory cells are fully unselected by which it is meant they have approximately 0V across the memory cell. The fully unselected memory cells 401d are pointed out in FIG. 6A. In this example, each fully unselected memory cell 401d has Vs/2 applied to its word line and Vs/2 applied to its bit line.

In the example of FIG. 6A there are more word lines than bit lines in the cross-point array. In another embodiment, there are more bit lines than word lines in the cross-point array. In another embodiment, the number of bit lines equals the number of word lines in the cross-point array. In the example of FIG. 6A there are twice as many word lines as bit lines in the cross-point array; however, a different ratio could be used. Thereby, different tile sizes may be realized. For example, a tile may have 1024 BL by 2048 WL, which may be composed into a module of 2048×4096 cells by center driving the WL and BL between the four tiles. In one embodiment, read or write is performed on a group of memory cell by, for example, selecting one memory cell in each of a number of tiles. In some embodiments, more than one memory cell from a tile may be selected for a read.

Figure 6B:
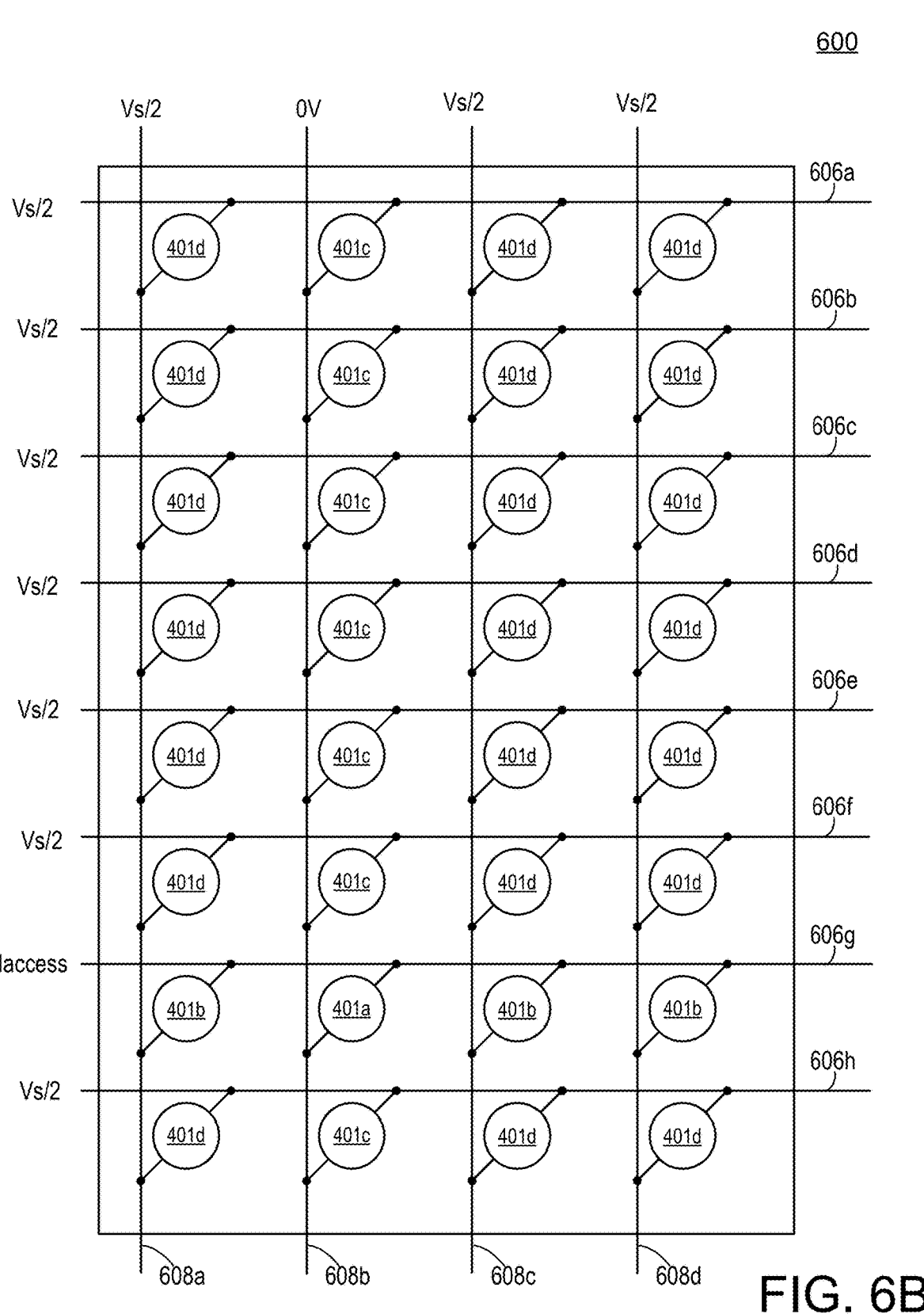

FIG. 6A is shown and described as using a voltage-force approach in which a voltage is provided to the selected word line. In an embodiment, a current-force approach is used to access the SOM cell. The current-force approach may be used to read or write the SOM cell. FIG. 6B depicts an example of a current-force approach. In the current-force approach, an access current (e.g., $I_{access}$) is driven to the selected word line (or sunk from the selected word line, depending on the direction of $I_{access}$). The selected bit line may be held at ground. As a result the current charges up the voltage on the selected word line. In an embodiment, the maximum magnitude of the selected word line voltage will be limited to Vs. Alternatively, the selected bit line may be held at a higher voltage, with the current being sunk from the selected word line. The unselected word lines and unselected bit lines have voltages applied thereto. The magnitudes of the voltages to the unselected word lines and unselected bit lines may be similar to the example in FIG. 6A. The half-select problems discussed in connection with the volt-age-force approach may also occur in a current-force approach. Herein, a term such as program signal may include both a program voltage and a program current. Likewise, a term such as read signal may include both a read voltage and a read current.

Figures 7, 8:
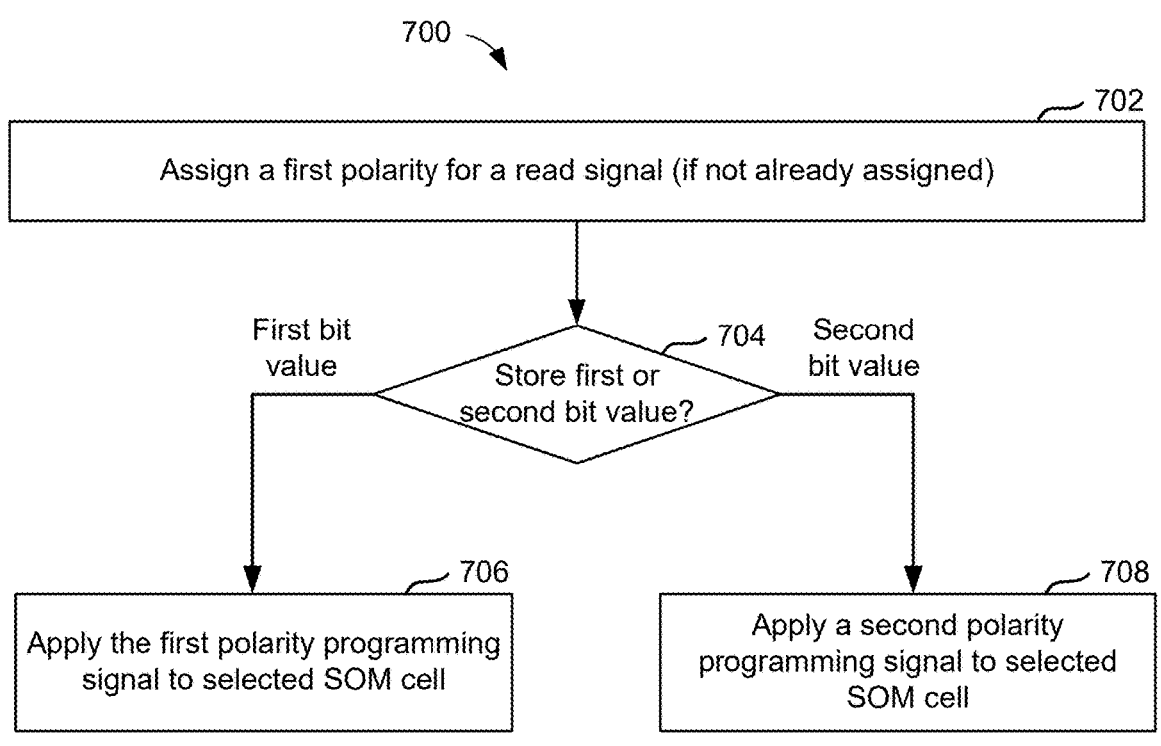
FIG. 7 is a flowchart of one embodiment of a process of programming a two-terminal threshold switching selector memory cell in a cross-point array.
FIG. 8 depicts two "Vth distributions" for embodiment of programming a SOM cell.

FIG. 7 is a flowchart of one embodiment of a process 700 of programming a SOM cell 401 in a cross-point array. The process 700 may be used to program a SOM cell 401 such as the one discussed in FIG. 5. In one embodiment, the SOM cell 401 includes an OTS that serves as the programmable resistance memory element. The process 700 may be per-formed on many memory cells in parallel, such as perform-ing the process in selected memory cells in different tiles 600. In one embodiment, process 700 is performed by one or more control circuits such as, but not limited to, one or more of memory controller 102, system control logic 260, column control circuitry 210, row control circuitry 220, a micro-controller, a state machine, host processor 122 and/or other control circuitry, or other analogous circuits that are used to control non-volatile memory.

Step 702 includes choosing a first polarity for future read signals applied to the SOM cell 401. Step 702 can be omitted if the choice of first polarity has already been established and does not need to be changed. The first polarity can be positive or negative. The current polarity may be defined based on the voltage across the cell that is caused by the current. Here, positive or negative polarity may be defined with respect to, for example, the selected word line and the selected bit line.

Step 704 includes a determination of whether to store a first bit value or a second bit value into the SOM cell 401. As one example, the first bit value is "0" and the second bit value is "1". As another example, the first bit value is "1" and the second bit value is "0." However, the bit values could be reversed from this example.

If the first bit value is to be stored, then step 706 is performed. Step 706 includes applying a programming (or write) signal having the first polarity to the SOM cell 401 cell 401. Thus, the programming signal in step 706 has the same polarity as the read signal if the cell is read in the future.

If the second bit value is to be stored, then step 708 is performed. Step 708 includes applying a programming signal having a second polarity to the SOM cell 401. The second polarity is opposite to the first polarity. Thus, the programming signal in step 708 has the opposite polarity as a future read signal. In steps 702, 706, and 708 either a current-force or a voltage-force technique may be used to apply the signals.

FIG. 8 depicts example Vth distributions for a group of SOM cells 402 after programming using process 700. FIG. 8 depicts two "Vth distributions" for the SOM cell 401 as they would be measured when read with a read signal of the first polarity discussed in process 700. Vth distribution 810 represents SOM cells 401 that store a first bit value. Vth distribution 820 represents SOM cells 401 that store a second bit value. The vertical axis represents the numbers of memory cells and is a log scale. The horizontal axis repre-sents the Vth of the threshold switching selector, assuming that the when the SOM cell 401 is read with a read voltage having the pre-assigned first polarity. A reference resistance R_ref is depicted between the two Vth distributions 810, 820. In an embodiment, R_ref is used to demarcate between the two Vth distributions. Note that if the SOM cells were instead to be read with a read signal having the second polarity, then the Vth distributions 810, 820 may be reversed.

FIG. 9A is a table 950 showing details of one embodiment of programming SOM cells in cross-point memory structure. Prior to programming the memory cells may be in either a W0 state or a W1 state. The "Last Fire" column 952 refers to the last signal that fired (e.g., switched on) the memory cell to be programmed. The Last Fire could be a write signal or a read signal. In this example, for a normal read operation the read signal has the same polarity as the write signal used to program to W0 state. The arrows in table 950 depict the relative polarities of the read and write signals. The normal read signal is referred to as R0 because it has the same polarity as the signal used to program to the W0 state. The read and write signals could be voltages or currents. The "New Data" column 954 refers to the how the memory cell is to be programmed. In this example, cells currently in the W1 state could be programmed to either the W1 state or the W0 state. Cells currently in the W0 state could be pro-grammed to either the W1 state or the W0 state.

Step 1 in this example is a referred to as a "read down", which refers to the down pointing arrow in step 1 in table 950. The "up-arrows" and "down-arrows" in table 950 refer to the relative polarities of the signals. Step 2 in this example is a referred to as a "read up", which refers to the up pointing arrow in step 2 in table 950. The term "read" is used for steps 1 and 2 due to the magnitude of the signals being similar to a normal read signal (and less than a typical program voltage). However, the memory system is not required to determine the states of the memory cells in response to applying the "read signal." In steps 1 and 2 the read signals may be applied to all memory cells in the group to be programmed. Step 3 in this example covers both "write down" and "write up". Write down refers to the down pointing arrow in step 3 in table 950. Write up refers to the up pointing arrow in step 3 in table 950. The write signals are applied selectively to only those memory cells to be programmed to the state associated with the write signal. Steps 1 and 2 are referred to as reads and are performed prior to the programming in step 3. However, the order of the reads in steps 1 and 2 may be switched. The write up and write down can be broken down into a separate write up step and a write down step.

Figure 9B:
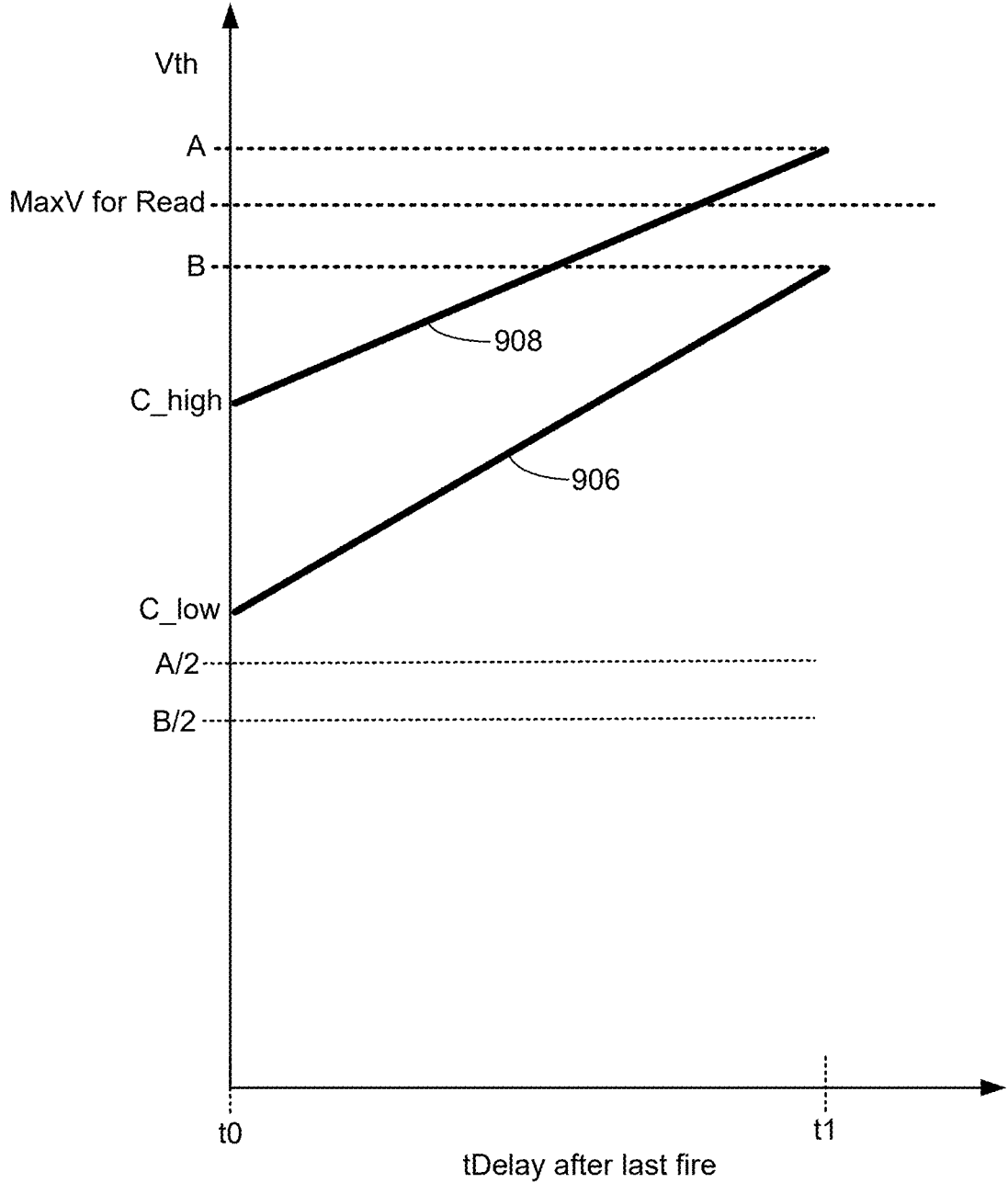
FIG. 9B depicts threshold voltages over time for an embodiment of operating SOM cells in a cross-point memory structure.

Table 950 will be discussed in more detail with reference to FIG. 9B. FIG. 9B depicts threshold voltages over time for an embodiment of operating SOM cells in a cross-point memory structure. Memory cells programmed to the W0 state may have a Vth at about C_low just after programming (t0). Memory cells programmed to the W1 state may have a Vth at about C_high just after programming (t0). The foregoing assumes the read is performed with the R0 signal having the same polarity as the signal used to program to W0. Herein, the terms "low Vth state" and "high Vth state" are used to refer to two such states (programmed with different polarity program voltages) that have different threshold voltages, assuming a default polarity read signal. Plot 906 depicts the upward drift in Vth of the threshold switching selectors in the SOM cells programmed to the W0 state. By t1, the Vth of the W0 cell has drifted to "B". Plot 908 depicts the upward drift in Vth of the threshold switching selectors in the SOM cells programmed to the W1 state. By t1, the Vth of the W1 cells has drifted to "A". The amount of Vth drift depicted in FIG. 9B is quite large, but even smaller Vth drifts can lead to issues, such as half-selection issues.

The Vth column 956 in the table 950 of FIG. 9A summarizes the Vth of a particular cell, which depends on the relative polarity of the last fire voltage (column 952) and the polarity of the write voltage (column 954). Cells having a last fire of W1 and new data of W1 have the same polarity voltage for these two voltages; therefore, the cells have a low Vth of B during the write of new data However, cells having a last fire of W1 and new data of W0 have opposite polarity voltages for these two voltages; therefore, the cells have a high Vth of A during the write of new data. Cells having a last fire of W0 (or R0) and new data of W1 have the opposite polarity voltages for these two voltages; therefore, the cells have a high Vth of A during the write of new data. Cells having a last fire of W0 (or R0) and new data of W0 have the same polarity voltages for these two voltages; therefore, the cells have a low Vth of B during the write of new data.

Referring now to an embodiment of a programming procedure, step 1 may include applying a read down signal to all cells in a group of cells to be programmed. For ease of discussion, the read signals will be referred to as read voltages. However, the read signals could be read currents, which increase (or decrease) the selected word line voltage to result in a voltage across the selected memory cell (the voltage may be clamped or otherwise limited to a maximum read voltage). Step 1 fires (switches on) all memory cells having a Vth at or below the magnitude of the maximum read voltage. With reference to FIG. 9B, the maximum read voltage may be at "MaxV for Read". Such a read down voltage will switch on the selectors in the cells whose last first was W0. Furthermore, firing the selectors may refresh the Vth such that the Vth is lowered from B to C. Referring to plot 906 in FIG. 9B, the Vth gets refreshed from the B level (at t1) back to the C_low level (at t0). However, the W1 cells have a Vth above MaxV for Read and therefore are not triggered (fired) by the read down voltage. Therefore, the W1 cells are not refreshed.

Step 2 is a read up, which fires (switches on) the memory cells that were last programmed to W1. This read up signal may be applied to all memory cells in the group to be programmed. Note that the read up has the same polarity as the W1 signal. Therefore, this has the effect of a lower Vth for the W1 cells. Step 2 therefore states that the W1 cells have a Vth of B. With reference to FIG. 9B, the maximum magnitude of the read voltage may be at "MaxV for Read". However, the polarity of the read voltage is the opposite of the read voltage in step 1. Such a read up voltage will switch on the selectors in the cells whose last first was W1. Thus, plot 908 may be viewed as a plot of Vth assuming a read down. However, applying a read up voltage may be viewed as moving the W1 cells from plot 906 to plot 908. The result is that the read up voltage has sufficient magnitude to switch on (fire) the selectors in the W1 cells. Therefore, the selectors in the W1 cells may be refreshed. The Vth may be lowered from B to C. Referring to plot 906 in FIG. 9B, the Vth may be refreshed from the B level (at t1) to the C_low level (at t0), with the assumption that the cells are read again with a read up voltage. However, reading the cells again with a read down voltage may result in a Vth of C_high.

Step 3 is in this example covers both write down and write up. The write down signal is only applied to those cells to be written to the W0 state. All cells written with the write down signal by definition end in the C_low state, with the assumption that the default read will be a read down signal. The write up signal is only applied to those cells to be written to the W1 state. All cells written with the write up signal by definition end in the C_high state, with the assumption that the default read will be a read down signal.

The programming process allows the magnitude of the programming voltages to be lowered, while still maintaining sufficient HS margin. With reference to FIG. 9B, the following are some example values to illustrate. The value for Clow may be about 2.5V. The value for C_high may be about 3.5V. The amount of Vth drift over an example time period may be about 0.5V (for both states). Therefore, the highest drifted value for the high Vth state may be about 4.0V and the highest drifted value for the low Vth state may be about 3.0V In this example, the magnitude for MaxV for Read may be about 3.25V. Thus, MaxV for Read may be a at a midpoint between the highest drifted value for the low Vth and the highest drifted value for the high Vth. Applying +3.25V across the cells switches on the threshold switching selectors for the low Vth state. Applying −3.25V across the cells switches on the threshold switching selectors for the high Vth state. Assuming that the cells for the high Vth state are refreshed to about 3.5V (for a default read polarity, which is positive in this example), a program voltage with a magnitude of about 3.7V may be used to allow for a safe margin. The program voltages for the two states may have the same magnitude, but opposite polarity.

FIG. 10 is a flowchart of one embodiment of a process 1000 of programming SOM cells in a cross-point memory structure. The SOM cells each have a threshold switching selector such as, but not limited to, an OTS. The process 1000 may employ a voltage-force technique such as in FIG. 6A or a current-force technique such as in FIG. 6B. Step 1002 includes applying a first signal having a first polarity to a group of memory cells selected for programming. In an embodiment, the group contains one memory cell in each of a number of tiles. The first signal switches on the threshold switching selector in a first set of the memory cells. The first set of the memory cells may be, for example, memory cells that were last programmed to W0. In an embodiment, memory cells last programmed to W1 will not fire (e.g., the threshold switching selector will not switch on). Step 1002 may refresh the Vth of the threshold switching selectors in the first set of cells. Referring to plot 906 in FIG. 9B as an example, the Vth may be refreshed from the B-level to the C_low level. With reference to FIG. 6A, the voltage Vs may be replaced with Vread. Step 1002 may include applying Vread to the selected word line while applying 0V to the selected bit line. With reference to FIG. 6B, Iaccess may be replaced with Iread and Vs could be replaced with Vread. Step 1002 may include applying Iread into the selected word line while applying 0V to the selected bit line. In both the voltage-force and current-force example, there will be a positive voltage across the selected cell from the selected word line to the selected bit line. Also, in step 1002 Vread/2 may be applied to unselected word lines and unselected bit lines.

Step 1004 includes applying a second signal having a second polarity to the group of memory cells selected for programming. The second signal switches on the threshold switching selector in a second set of the memory cells. The second set of the memory cells may be, for example, memory cells that were last programmed to W1. The second signal may have the same magnitude (but opposite polarity) as the first signal. Step 1004 may refresh the Vth of the threshold switching selectors in the second set of cells. Step 1004 may include applying Vread to the selected bit line while applying 0V to the selected word line. Step 1004 may include applying a negative read current to the selected word line while applying Vs to the selected bit line. Here, the negative read current means that a current driver may sink a current from the selected word line. Also, in step 1004 Vread/2 may be applied to unselected word lines and unselected bit lines. In both the voltage-force and current-force example, there will be a negative voltage across the selected cell from the selected word line to the selected bit line.

Step 1006 includes applying a third signal having the first polarity to a third set of the group of memory cells after applying both the first signal and the second signal to the group of the memory cells. The third signal programs the threshold switching selectors of the memory cells in the third set to a first state. The third set of cells may include, for example, cells to be programmed to W0. Referring to FIG. 9A the third set may include some of the cells with a last fire 952 (prior to the reads) of W1 and some of the cells with a last fire 952 (prior to the reads) of W0. With reference to FIG. 6A, the voltage Vs may be replaced with Vwrite. Step 1006 may include applying Vwrite to the selected word line while applying 0V to the selected bit line. With reference to FIG. 6B, the Iaccess may be replaced with Iwrite and Vs may be replaced with Vwrite. Step 1006 may include applying Iwrite into the selected word line while applying 0V to the selected bit line. Also, in step 1006 Vwrite/2 may be applied to unselected word lines and unselected bit lines. In both the voltage-force and current-force example, there will be a positive voltage across the selected cell from the selected word line to the selected bit line.

Step 1008 includes applying a fourth signal having the second polarity to a fourth set of the group of memory cells after applying both the first signal and the second signal to the group of the memory cells. The fourth signal programs the threshold switching selectors of the memory cells in the fourth set to a second state. The fourth set of cells may include, for example, cells to be programmed to W1. Referring to FIG. 9A the fourth set may include some of the cells with a last fire 952 (prior to the reads) of W1 and some of the cells with a last fire 952 (prior to the reads) of W0. With reference to FIG. 6A, step 1008 may include applying Vwrite to the selected bit line while applying 0V to the selected word line. For unselected word lines and unselected bit lines Vs may be replaced with Vwrite. With reference to FIG. 6B, Iaccess may be replaced with Iwrite having a negative value (e.g., a current driver sinks Iwrite from the selected word line 606g. Vs may be replaced with Vwrite. Also, in step 1008 Vwrite/2 may be applied to unselected word lines and unselected bit lines. In both the voltage-force and current-force example, there will be a negative voltage across the selected cell from the selected word line to the selected bit line.

In an embodiment, steps 1006 and 1008 are performed concurrently. For example, a selected SOM cell in each of a first set of tiles may be written in step 1006 while a selected SOM cell in each of a second set of tiles may be written in step 1008. In an embodiment, step 1006 is performed prior to step 1008. In an embodiment, step 1008 is performed prior to step 1006.

FIG. 11 is a flowchart of one embodiment of a process 1100 of programming SOM cells in a cross-point memory structure. The SOM cells each have a threshold switching selector such as, but not limited to, an OTS. Process 1100 provides more details of an embodiment of process 1000. In an embodiment, the group of cells to be programmed contains one memory cell in each of a number of tiles. The process 1100 may employ a voltage-force technique such as in FIG. 6A or a current-force technique such as in FIG. 6B. Step 1102 includes applying first read signal to group of memory cells to trigger cells programmed to first state but not a second state. As an example, the first read signal may trigger cells that were programmed to W0 but not those cells programmed to W1. Triggering the cells causes the threshold switching selector to switch on, which may refresh the Vth of the threshold switching selector. Step 1102 may include applying Vread to the selected word line while applying 0V to the selected bit line. Step 1102 may include applying Iread into the selected word line while applying 0V to the selected bit line. The voltage across each memory cell may be limited or capped when applying Iread.

Step 1104 includes applying a second read signal to group of memory cells. The second read signal has opposite polarity as the first read signal. Applying the second read signal results in the same maximum voltage across the memory cells as applying the first read signal. The second signal switches on the threshold switching selector in at least a second set of the memory cells. The second set of the memory cells may be, for example, memory cells that were last programmed to W1. Step 1104 may refresh the Vth of the threshold switching selectors in the second set of cells. Step 1104 may include applying Vread to the selected bit line while applying 0V to the selected word line. Step 1104 may include sinking Iread from the selected word line while applying a select voltage to the selected bit line. The voltage across each memory cell may be limited or capped when applying Iread.

Step 1106 includes applying a first write signal to a first set of the group of cells to write the first set to the first state. The first write signal has the same polarity as the first read signal. The first set of cells may include, for example, cells to be programmed to W0. Step 1106 may include applying Vwrite to the selected word line while applying 0V to the selected bit line. Step 1106 may include applying Iwrite to the selected word line while applying 0V to the selected bit line.

Step 1108 includes applying a second write signal to a second set of the group of cells to write the second set to the second state. The second write signal has the opposite polarity as the first write signal. The second set of cells may include, for example, cells to be programmed to W1. Step 1108 may include applying Vwrite to the selected bit line while applying 0V to the selected word line. Step 1108 may include sinking Iwrite from the selected word line while applying a select voltage to the selected bit line.

In an embodiment, steps 1106 and 1108 are performed concurrently. In an embodiment, step 1106 is performed prior to step 1108. In an embodiment, step 1108 is performed prior to step 1106.

FIG. 12 is a flowchart of one embodiment of a process 1200 of programming SOM cells in a cross-point memory structure. The SOM cells each have a threshold switching selector such as, but not limited to, an OTS. Process 1200 provides further details of an embodiment of process 1000. In an embodiment, the group of SOM cells to be programmed contains one memory cell in each of a number of tiles. The process 1200 may employ a voltage-force technique such as in FIG. 6A or a current-force technique such as in FIG. 6B. Step 1202 includes causing a first voltage across each cell in a group of memory cells to reduce threshold voltage drift in the threshold switching selectors in memory cells in the group that were most recently programmed to a first state. The first set of the memory cells may be, for example, memory cells that were last programmed to W0. Step 1202 may include applying the first voltage to the selected word line while applying 0V to the selected bit line. Step 1202 may include applying a current to the selected word line while applying 0V to the selected bit line to result in the first voltage across each cell. In an embodiment, the first voltage has a maximum magnitude. In a current-force approach a fixed magnitude current may be used to charge up the selected word line, but the word line voltage may be limited to the maximum voltage.

Step 1204 includes causing a second voltage across each cell in the group of memory cells following the first voltage. The second voltage has same magnitude but opposite polarity as the first voltage. The second voltage may reduce threshold voltage drift in the threshold switching selectors in memory cells in the group that were most recently programmed to a second state (e.g., W1). Step 1204 may include applying the second voltage to the selected bit line while applying 0V to the selected word line. Step 1204 may include sinking a current from the selected word line while applying a high voltage to the selected bit line to result in the second voltage across each cell. In a current-force approach, the selected word line and the selected bit line may each be pre-charged to a voltage about half of the final voltage of the selected bit line (e.g., 1.65V). Then, the selected bit line may be raised to a higher voltage (e.g., 3.3V) with the current used to lower the voltage on the selected word line. The lowest the selected word line can go is 0V in this example. Therefore, the voltage across the selected cells is limited to a maximum voltage.

Step 1206 includes causing a third voltage having the first polarity voltage across each cell in a first set of the group of memory cells to write the threshold switching selectors in a first set of memory cells to the first state. The first set of cells may include, for example, cells to be programmed to W0. Step 1206 may include applying Vwrite to the selected word line while applying 0V to the selected bit line. Step 1206 may include applying a write current to the selected word line while applying 0V to the selected bit line to result in the third voltage across each cell.

Step 1208 includes causing a fourth voltage having the second polarity voltage across each cell in a second set of the group of memory cells to write the threshold switching selectors in a second set of memory cells to the second state. The second set of cells may include, for example, cells to be programmed to W1. Step 1208 may include applying Vwrite to the selected bit line while applying 0V to the selected word line. Step 1208 may include sinking a write current from the selected word line while applying a high voltage to the selected bit line to result in the fourth voltage across each cell.

In an embodiment, steps 1206 and 1208 are performed concurrently. In an embodiment, step 1206 is performed prior to step 1208. In an embodiment, step 1208 is performed prior to step 1206.

In view of the foregoing, it can be seen that, according to an embodiment, an apparatus comprises one or more control circuits configured to connected to a cross-point structure having self-selecting memory cells. Each self-selecting memory cell has a threshold switching selector. The one or more control circuits are configured to apply a first signal having a first polarity to a group of memory cells selected for programming. The first signal switches on the threshold switching selectors in a first set of the memory cells. The one or more control circuits are configured to apply a second signal having a second polarity to the group of memory cells selected for programming. The second signal switches on the threshold switching selectors in a second set of the memory cells. The one or more control circuits are configured to apply a third signal having the first polarity to a third set of the group of memory cells after applying both the first signal and the second signal to the group of the memory cells. The third signal programs the threshold switching selectors in the third set of the memory cells to a first state. The one or more control circuits are configured to apply a fourth signal having the second polarity to a fourth set of the group of memory cells after applying both the first signal and the second signal to the group of the memory cells. The fourth signal programs the threshold switching selectors in the fourth set of the memory cells to a second state.

In a further embodiment, the one or more control circuits are configured to establish a magnitude of the first signal to create a maximum voltage across the memory cells in the group between a first highest drifted threshold voltage of memory cells in the group that were most recently programmed to the first state and a second highest drifted threshold voltage of memory cells in the group that were most recently programmed to the second state.

In a further embodiment, the one or more control circuits are configured to establish a magnitude of the first signal to create a maximum voltage across the memory cells in the group at a midpoint between a first highest drifted threshold voltage for memory cells in the group programmed to a low threshold voltage state and second highest drifted threshold voltage for memory cells in the group programmed to a high threshold voltage state.

In a further embodiment, the first set of the memory cells were most recently programmed to the first state. The first signal has a magnitude and polarity that switches on the threshold switching selectors of memory cells most recently programmed to the first state but does not switch on the threshold switching selectors of memory cells most recently programmed to the second state.

In a further embodiment, the first signal has a magnitude and polarity to remove drift in threshold voltages of the threshold switching selectors of the first set of the memory cells but does not switch on the threshold switching selectors in the second set of the memory cells.

In a further embodiment, the second signal has a magnitude and polarity to remove drift in threshold voltages of the threshold switching selectors of the second set of the memory cells that were most recently programmed to the second state.

In a further embodiment, the first signal has a magnitude to demarcate between the first state and the second state. The second signal has the magnitude to demarcate between the first state and the second state.

In a further embodiment, the one or more control circuits are configured to concurrently apply the third signal to the third set of the group of memory cells and the fourth signal to the fourth set of the group of memory cells.

In a further embodiment, the one or more control circuits are configured to apply the third signal to the third set of the memory cells and the fourth signal to the fourth set of the memory cells without determining memory cell states in response to either the first signal or the second signal.

In a further embodiment, the first signal and the second signal are voltages having substantially the same magnitude.

In a further embodiment, the first signal and the second signal are currents having substantially the same magnitude.

An embodiment includes a method for operating a cross-point memory structure having self-selecting memory cells.

The method comprises applying a first read signal to a group of the memory cells that triggers memory cells that were most recently programmed to a first state but does not trigger memory cells were most recently programmed to a second state. The first read signal has a first polarity and creates a first maximum voltage across each particular cell in the group. The method comprises applying a second read signal to the group of the memory cells after applying the first read signal to the group. The second read signal has a second polarity opposite the first polarity and creates the first maximum voltage across each particular cell in the group. The method comprises applying a first write signal to a first set of the group of memory cells to write the first set to the first state after applying both the first read signal and the second read signal to the group of the memory cells. The first write signal has the first polarity. The method comprises applying a second write signal to a second set of the group of memory cells to write the second set to the second state after applying both the first read signal and the second read signal to the group of the memory cells. The second write signal has the second polarity.

An embodiment includes a memory system comprising a cross-point memory structure having first conductive lines, second conductive lines, and memory cells. Each memory cell at a junction of one of the first conductive lines and one of the second conductive lines. Each memory cell has a threshold switching selector. The memory system has one or more control circuits in communication with the cross-point memory structure. The one or more control circuits are configured to cause a first voltage across each memory cell in a group of memory cells selected for programming. The first voltage has a first maximum magnitude and a first polarity that reduces threshold voltage drift in the threshold switching selectors in memory cells in the group that were most recently programmed to a first state. The one or more control circuits are configured to cause a second voltage across each memory cell in the group of memory cells following causing the first voltage to the group of memory cells. The second voltage has substantially the first maximum magnitude and a second polarity opposite the first polarity. The one or more control circuits are configured to cause a third voltage having the first polarity across each memory cell in a first set of memory cells in the group to write the threshold switching selectors in the first set of memory cells to the first state. The third voltage caused after causing both the first voltage and the second voltage. The one or more control circuits are configured to cause a fourth voltage having the second polarity across each memory cell in the group in a second set of memory cells in the group to write the threshold switching selectors in the second set of memory cells to a second state. The fourth voltage caused after causing both the first voltage and the second voltage.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable tolerance for a given application.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connected to a cross-point structure having self-selecting memory cells, each self-selecting memory cell having a threshold switching selector, the one or more control circuits configured to:
apply a first signal having a first polarity to a group of memory cells selected for programming, the first signal switches on the threshold switching selectors in a first set of the memory cells;
apply a second signal having a second polarity to the group of memory cells selected for programming, the second signal switches on the threshold switching selectors in a second set of the memory cells;
apply a third signal having the first polarity to a third set of the group of memory cells after applying both the first signal and the second signal to the group of the memory cells, the third signal programs the threshold switching selectors in the third set of the memory cells to a first state; and
apply a fourth signal having the second polarity to a fourth set of the group of memory cells after applying both the first signal and the second signal to the group of the memory cells, the fourth signal programs the threshold switching selectors in the fourth set of the memory cells to a second state.

2. The apparatus of claim 1, wherein the one or more control circuits are configured to establish a magnitude of the first signal to create a maximum voltage across the memory cells in the group between a first highest drifted threshold voltage of memory cells in the group that were most recently programmed to the first state and a second highest drifted threshold voltage of memory cells in the group that were most recently programmed to the second state.

3. The apparatus of claim 1, wherein the one or more control circuits are configured to establish a magnitude of the first signal to create a maximum voltage across the memory cells in the group at a midpoint between a first highest drifted threshold voltage for memory cells in the group programmed to a low threshold voltage state and second highest drifted threshold voltage for memory cells in the group programmed to a high threshold voltage state.

4. The apparatus of claim 1, wherein the first set of the memory cells were most recently programmed to the first state, the first signal has a magnitude and polarity that switches on the threshold switching selectors of memory cells most recently programmed to the first state but does not switch on the threshold switching selectors of memory cells most recently programmed to the second state.

5. The apparatus of claim 1, wherein the first signal has a magnitude and polarity to remove drift in threshold voltages of the threshold switching selectors of the first set of the memory cells but does not switch on the threshold switching selectors in the second set of the memory cells.

6. The apparatus of claim 5, wherein the second signal has a magnitude and polarity to remove drift in threshold voltages of the threshold switching selectors of the second set of the memory cells that were most recently programmed to the second state.

7. The apparatus of claim 1, wherein:
the first signal has a magnitude to demarcate between the first state and the second state; and
the second signal has the magnitude to demarcate between the first state and the second state.

8. The apparatus of claim 1, wherein the wherein the one or more control circuits are configured to concurrently apply the third signal to the third set of the group of memory cells and the fourth signal to the fourth set of the group of memory cells.

9. The apparatus of claim 1, wherein the one or more control circuits are configured to:
apply the third signal to the third set of the memory cells and the fourth signal to the fourth set of the memory cells without determining memory cell states in response to either the first signal or the second signal.

10. The apparatus of claim 1, wherein the first signal and the second signal are voltages having substantially the same magnitude.

11. The apparatus of claim 1, wherein the first signal and the second signal are currents having substantially the same magnitude.

12. A method for operating a cross-point memory structure having self-selecting memory cells, the method comprising:
applying a first read signal to a group of the memory cells that triggers memory cells that were most recently programmed to a first state but does not trigger memory cells were most recently programmed to a second state, the first read signal having a first polarity and creating a first maximum voltage across each particular cell in the group;
applying a second read signal to the group of the memory cells after applying the first read signal to the group, the second read signal having a second polarity opposite the first polarity and creating the first maximum voltage across each particular cell in the group;
applying a first write signal to a first set of the group of memory cells to write the first set to the first state after applying both the first read signal and the second read signal to the group of the memory cells, the first write signal having the first polarity; and
applying a second write signal to a second set of the group of memory cells to write the second set to the second state after applying both the first read signal and the second read signal to the group of the memory cells, the second write signal having the second polarity.

13. The method of claim 12, further comprising:
establishing a magnitude of the first read signal to create a maximum voltage across the memory cells in the group between a first highest drifted threshold voltage of memory cells in the group that were most recently programmed to the first state and a second highest drifted threshold voltage of memory cells in the group that were most recently programmed to the second state.

14. The method of claim 12, further comprising:
establishing a magnitude of the first read signal to create a maximum voltage across the memory cells in the group at a midpoint between a first highest drifted threshold voltage for memory cells programmed to a low threshold voltage state and second highest drifted threshold voltage for memory cells programmed to a high threshold voltage state.

15. The method of claim 12, wherein applying the first write signal to the first set of the group and applying the second write signal to the second set of the group are performed without determining memory cell states in response to either the first read signal or the second read signal.

16. A memory system comprising:
a cross-point memory structure having first conductive lines, second conductive lines, and memory cells, each memory cell at a junction of one of the first conductive lines and one of the second conductive lines, each memory cell having a threshold switching selector;
one or more control circuits in communication with the cross-point memory structure, the one or more control circuits configured to:
cause a first voltage across each memory cell in a group of memory cells selected for programming, the first voltage having a first maximum magnitude and a first polarity that reduces threshold voltage drift in the threshold switching selectors in memory cells in the group that were most recently programmed to a first state;
cause a second voltage across each memory cell in the group of memory cells following causing the first voltage to the group of memory cells, the second voltage having substantially the first maximum magnitude and a second polarity opposite the first polarity;
cause a third voltage having the first polarity across each memory cell in a first set of memory cells in the group to write the threshold switching selectors in the first set of memory cells to the first state, the third voltage caused after causing both the first voltage and the second voltage; and
cause a fourth voltage having the second polarity across each memory cell in the group in a second set of memory cells in the group to write the threshold switching selectors in the second set of memory cells to a second state, the fourth voltage caused after causing both the first voltage and the second voltage.

17. The memory system of claim 16, wherein the one or more control circuits are configured to cause the first maximum magnitude for the first voltage between a first highest drifted threshold voltage of the memory cells most recently programmed to the first state and a second highest drifted threshold voltage of memory cells most recently programmed to the second state.

18. The memory system of claim 16, wherein the one or more control circuits are configured to cause the first maximum magnitude for the first voltage at a midpoint between a first highest drifted threshold voltage for memory cells programmed to a low threshold voltage state and second highest drifted threshold voltage for memory cells programmed to a high threshold voltage state.

19. The memory system of claim 16, wherein the one or more control circuits are configured to:

cause the first maximum magnitude for the first voltage to refresh drifted threshold voltages of the memory cells most recently programmed to the first state without triggering the threshold switching selector in the memory cells most recently programmed to the second state.

20. The memory system of claim 16, wherein the one or more control circuits are configured to:

concurrently cause the third voltage across memory cells in the first set and the fourth voltage across memory cells in the second set.

\* \* \* \* \*